(12) United States Patent
Sanuki et al.

(10) Patent No.: US 11,411,016 B2
(45) Date of Patent: Aug. 9, 2022

(54) SEMICONDUCTOR MEMORY DEVICE

(71) Applicant: KIOXIA CORPORATION, Tokyo (JP)

(72) Inventors: Tomoya Sanuki, Yokkaichi Mie (JP);
Keisuke Nakatsuka, Kobe Hyogo (JP);
Hiroshi Maejima, Setagaya Tokyo (JP);
Kenichiro Yoshii, Bunkyo Tokyo (JP);
Takashi Maeda, Kamakura Kanagawa (JP); Hideo Wada, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/005,535

(22) Filed: Aug. 28, 2020

(65) Prior Publication Data
US 2021/0296298 A1 Sep. 23, 2021

(30) Foreign Application Priority Data
Mar. 19, 2020 (JP) .............................. JP2020-049532

(51) Int. Cl.
*H01L 27/11565* (2017.01)
*H01L 25/18* (2006.01)
(Continued)

(52) U.S. Cl.
CPC ........ *H01L 27/11565* (2013.01); *H01L 24/08* (2013.01); *H01L 25/18* (2013.01); *H01L 25/50* (2013.01); *H01L 27/1157* (2013.01); *H01L 27/11563* (2013.01); *H01L 27/11568* (2013.01); *H01L 27/11575* (2013.01); *H01L 27/11578* (2013.01); *H01L 2224/08145* (2013.01);
(Continued)

(58) Field of Classification Search
CPC . H01L 25/18; H01L 24/08; H01L 2924/1424; H01L 2224/08145; H01L 2924/14511; H01L 27/0688; H01L 27/11514; H01L 27/11519; H01L 27/11521; H01L 27/11551; H01L 27/11556; H01L 27/11568; H01L 27/11578; H01L 27/11582
See application file for complete search history.

(56) References Cited

U.S. PATENT DOCUMENTS 9,997,530 B2 * 6/2018 Yon ....................... H01L 27/249
10,685,875 B2 6/2020 Hatano
(Continued)

FOREIGN PATENT DOCUMENTS

JP 2019-140178 A 8/2019

*Primary Examiner* — Eduardo A Rodela
(74) *Attorney, Agent, or Firm* — Kim & Stewart LLP

(57) ABSTRACT

A semiconductor memory device includes a first chip and a second chip overlaid on the first chip. The second chip includes a memory cell array provided between a second semiconductor substrate and the first chip in a first direction, and first and second wires between the memory cell array and the first chip. The memory cell array includes three or more stacked bodies regularly arranged in a second direction perpendicular to the first direction and semiconductor layers extending in the stacked bodies in the first direction. Each of the stacked bodies includes gate electrodes stacked in the first direction. The first and second wires are aligned in the second direction with a gap therebetween.

12 Claims, 20 Drawing Sheets

(51) Int. Cl.
*H01L 25/00* (2006.01)
*H01L 23/00* (2006.01)
*H01L 27/11578* (2017.01)
*H01L 27/11575* (2017.01)
*H01L 27/1157* (2017.01)
*H01L 27/11563* (2017.01)
*H01L 27/11568* (2017.01)

(52) U.S. Cl.
CPC ............... *H01L 2924/1424* (2013.01); *H01L 2924/14511* (2013.01)

(56) References Cited

U.S. PATENT DOCUMENTS

| | | | |
|---|---|---|---|
| 2016/0240547 A1* | 8/2016 | Tagami | H01L 27/11565 |
| 2019/0341394 A1* | 11/2019 | Hasegawa | H01L 27/115 |
| 2020/0058669 A1* | 2/2020 | Chen | H01L 27/11582 |

* cited by examiner

SEMICONDUCTOR MEMORY DEVICE

CROSS-REFERENCE TO RELATED APPLICATION(S)

This application is based upon and claims the benefit of priority from Japanese Patent Application No. 2020-049532, filed on Mar. 19, 2020, the entire contents of which are incorporated herein by reference.

FIELD

Embodiments described herein relate generally to a semiconductor memory device.

BACKGROUND

Wafer bonding technology provides highly functional or highly integrated semiconductor devices by bonding two wafers, each having an integrated circuit formed thereon. For example, a semiconductor wafer in which a memory cell array is formed and a semiconductor wafer in which a control circuit for controlling the memory cell array is formed are bonded to each other. Thereafter, the bonded semiconductor wafers are divided into a plurality of chips by dicing, whereby a highly functional or highly integrated semiconductor memory can be achieved.

DETAILED DESCRIPTION

Figure 1:
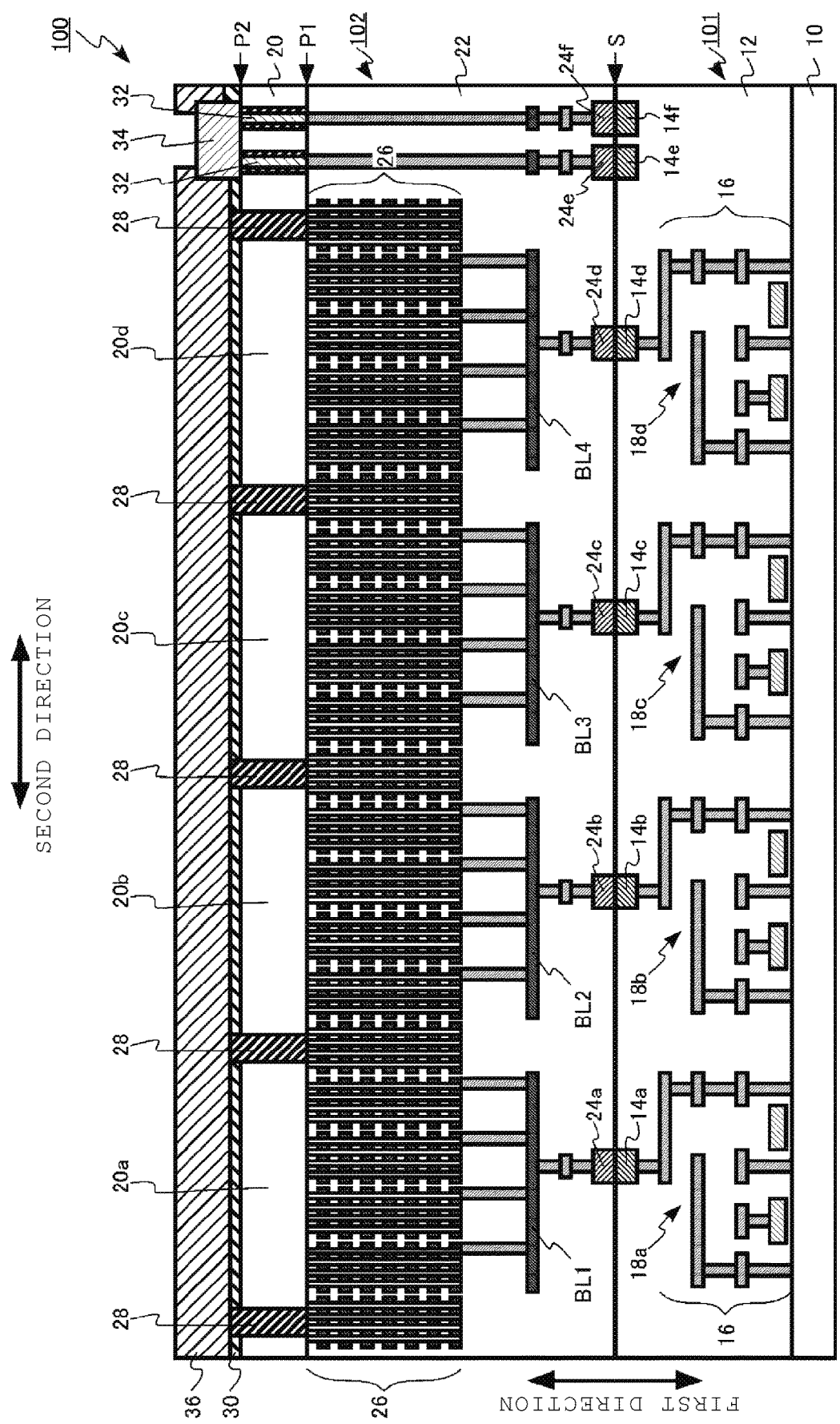
FIG. 1 illustrates a schematic cross-sectional view of a part of a semiconductor memory device according to a first embodiment.

In general, according to an embodiment, a semiconductor memory device includes first and second chips. The first chip includes a first semiconductor substrate, first and second pads, and a semiconductor circuit. The second chip is on the first chip and includes a second semiconductor substrate, third and fourth pads in contact with the first and second pads, respectively, a memory cell array provided between the second semiconductor substrate and the first chip in a first direction, and first and second wires provided between the memory cell array and the first chip in the first direction. The memory cell array includes three or more stacked bodies regularly arranged in a second direction perpendicular to the first direction and a plurality of semiconductor layers extending in the stacked bodies in the first direction. Each of the stacked bodies includes a plurality of gate electrodes stacked in the first direction. The first and second lines are aligned in the second direction with a gap therebetween. The first wire is connected to at least one of the semiconductor layers extending in each stacked body in a first group of the stacked bodies, and not to any of the semiconductor layers extending in any stacked body in a second group of the stacked bodies. The second wire is connected to at least one of the semiconductor layers extending in each stacked body in the second group, and not to any of the semiconductor layers extending in any stacked body in the first group.

Hereinafter, certain example embodiments of the present disclosure will be described with reference to the drawings. In the following description, the same or substantially similar members, components, or aspects will be denoted by the same reference symbols, and description may be appropriately omitted.

Also, in the present disclosure, the terms "upper" or "lower" may be used for convenience. "Upper" and "lower" are terms indicating a relative positional relationship in the drawing, for example. The term "upper" or "lower" does not necessarily define the positional relationship with respect to gravity.

The qualitative analysis and the quantitative analysis of the chemical composition of the members, components, or aspects constituting a semiconductor memory device in the present disclosure may be performed by, for example, secondary ion mass spectrometry (SIMS) and/or energy dispersive X-ray spectroscopy (EDX). Furthermore, a transmission electron microscope (TEM) or a scanning electron microscope (SEM) may be used to measure the thickness of various portions, components, or aspects of a semiconductor memory device or a distance between such portions, components, or aspects.

First Embodiment

The semiconductor memory device according to a first embodiment includes a first chip including a first semiconductor substrate, a first pad, a second pad, and a semiconductor circuit; and a second chip including a second semiconductor substrate, a third pad in contact with the first pad, a fourth pad in contact with the second pad. A memory cell array is between the second semiconductor substrate and the first chip. The memory cell array includes a plurality of stacked bodies including a plurality of gate electrode layers repeatedly arranged apart from each other in a first direction. The gate electrode layers have a first width in a second direction perpendicular to the first direction and are repeatedly arranged at a first interval in the second direction. A plurality of semiconductor layers is provided in the stacked bodies. The semiconductor layers extend in the first direction and are regularly arranged in a plane perpendicular to the first direction. A charge storage layer is provided between at least one of the plurality of semiconductor layers and at least one of the plurality of gate electrode layers. A first wiring is provided between the memory cell array and the first chip and extends in the second direction. The first wiring is electrically connected to a first semiconductor layer that is one of the plurality of semiconductor layers. A second wiring is provided between the memory cell array and the first chip and extends in the second direction. The second wiring is located on an extension line from the first wiring (the first and second wiring are aligned) but separated from the first wiring by a gap left therebetween. The second wiring is electrically connected to a second semiconductor layer that is another one of the plurality of semiconductor layers.

The semiconductor memory device according to the first embodiment is a flash memory 100. The flash memory 100 is a three-dimensional NAND flash memory in which memory cells are three-dimensionally arranged.

Figure 2:
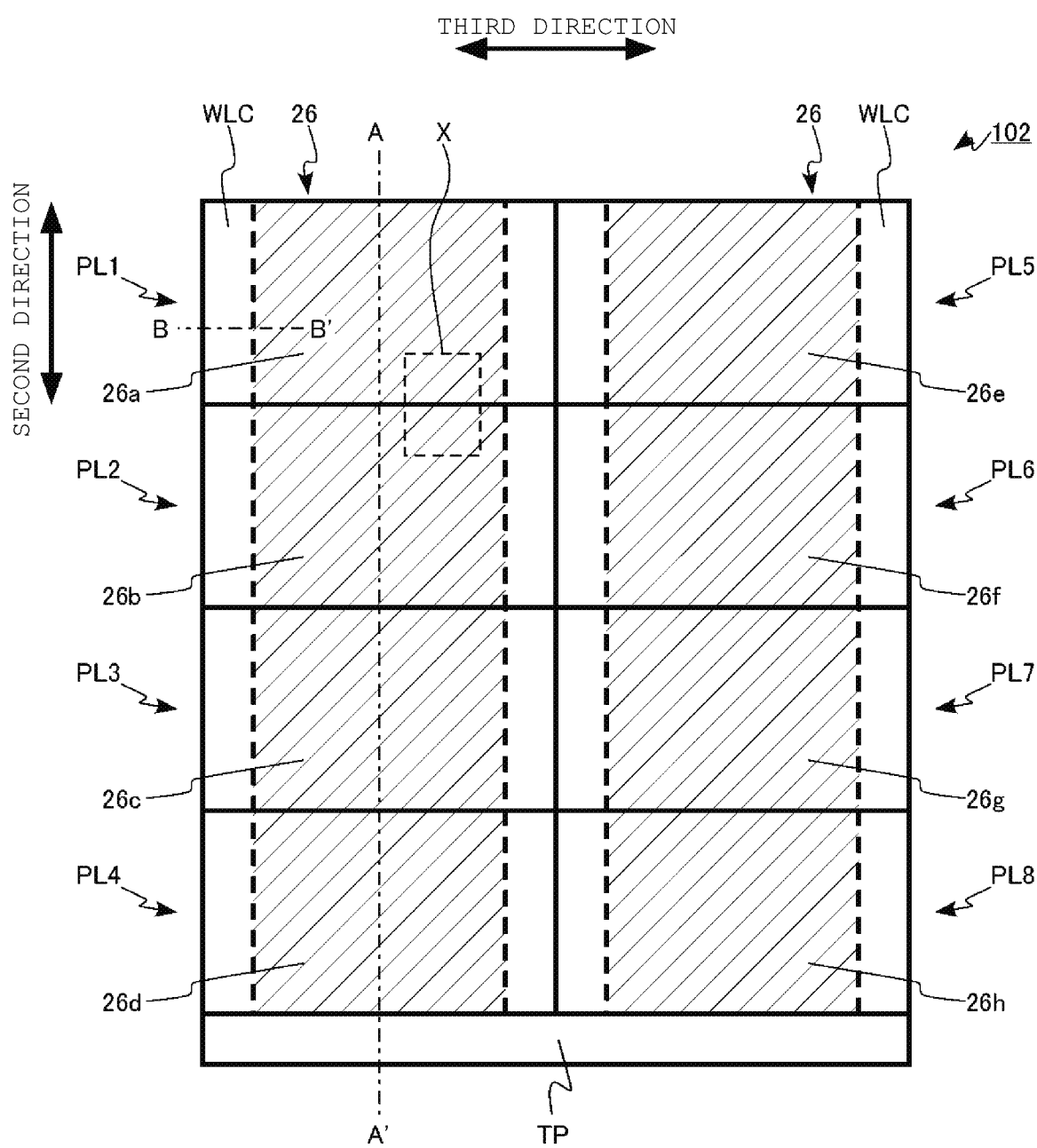
FIG. 2 is a layout diagram of the semiconductor memory device according to the first embodiment.

FIG. 1 illustrates a schematic cross-sectional view of apart of the semiconductor memory device according to the first embodiment. FIG. 2 is a layout diagram of the semiconductor memory device according to the first embodiment. FIG. 2 shows the layout of the plane of a memory chip 102 of the flash memory 100, a memory cell array, a word line contact region, and a terminal pad region. FIG. 1 illustrates a cross section taken along a line AA' of FIG. 2.

The flash memory 100 according to the first embodiment includes a control chip 101 and the memory chip 102. The control chip 101 is an example of a first chip. The memory chip 102 is an example of a second chip.

The control chip 101 includes a first semiconductor substrate 10, a first interlayer region 12, first metal pads 14a, 14b, 14c, 14d, 14e, and 14f, and a control circuit 16. The control circuit 16 includes a first sense amplifier circuit 18a, a second sense amplifier circuit 18b, a third sense amplifier circuit 18c, and a fourth sense amplifier circuit 18d.

The first metal pad 14a is an example of a first pad. The first metal pad 14b is an example of a second pad. The control circuit 16 is an example of a semiconductor circuit.

Hereinafter, the first metal pads 14a, 14b, 14c, 14d, 14e, and 14f may be simply referred to as the first metal pads 14a to 14f for simplification. Further, the first metal pads 14a to 14f and the metal pads having the same function as these may be collectively referred to as first metal pads 14.

The memory chip 102 includes a second semiconductor substrate 20, a second interlayer region 22, second metal pads 24a, 24b, 24c, 24d, 24e, and 24f, a memory cell array 26, an element isolation insulating layer 28, a back surface insulating layer 30, a through via 32, a terminal pad 34, a passivation film 36, a first bit line BL1, a second bit line BL2, a third bit line BL3, a fourth bit line BL4, a first plane PL1, a second plane PL2, a third plane PL3, a fourth plane PL4, a fifth plane PL5, a sixth plane PL6, a seventh plane PL7, an eighth plane PL8, a word line contact region WLC, and a terminal pad region TP.

The second metal pad 24a is an example of a third pad. The second metal pad 24b is an example of a fourth pad. The first bit line BL1 is an example of a first wiring. The second bit line BL2 is an example of a second wiring.

Hereinafter, the second metal pads 24a, 24b, 24c, 24d, 24e, and 24f may be simply referred to as the second metal pads 24a to 24f for simplification. Further, the second metal pads 24a to 24f and the metal pads having the same function as these may be collectively referred to as second metal pads 24.

Further, the first bit line BL1, the second bit line BL2, the third bit line BL3, the fourth bit line BL4, and the bit lines having the same function as these may be collectively described as bit lines BL.

The second semiconductor substrate 20 includes a first plate region 20a, a second plate region 20b, a third plate region 20c, and a fourth plate region 20d. The first plate region 20a is an example of a first semiconductor region. The second plate region 20b is an example of a second semiconductor region.

Figure 4A:
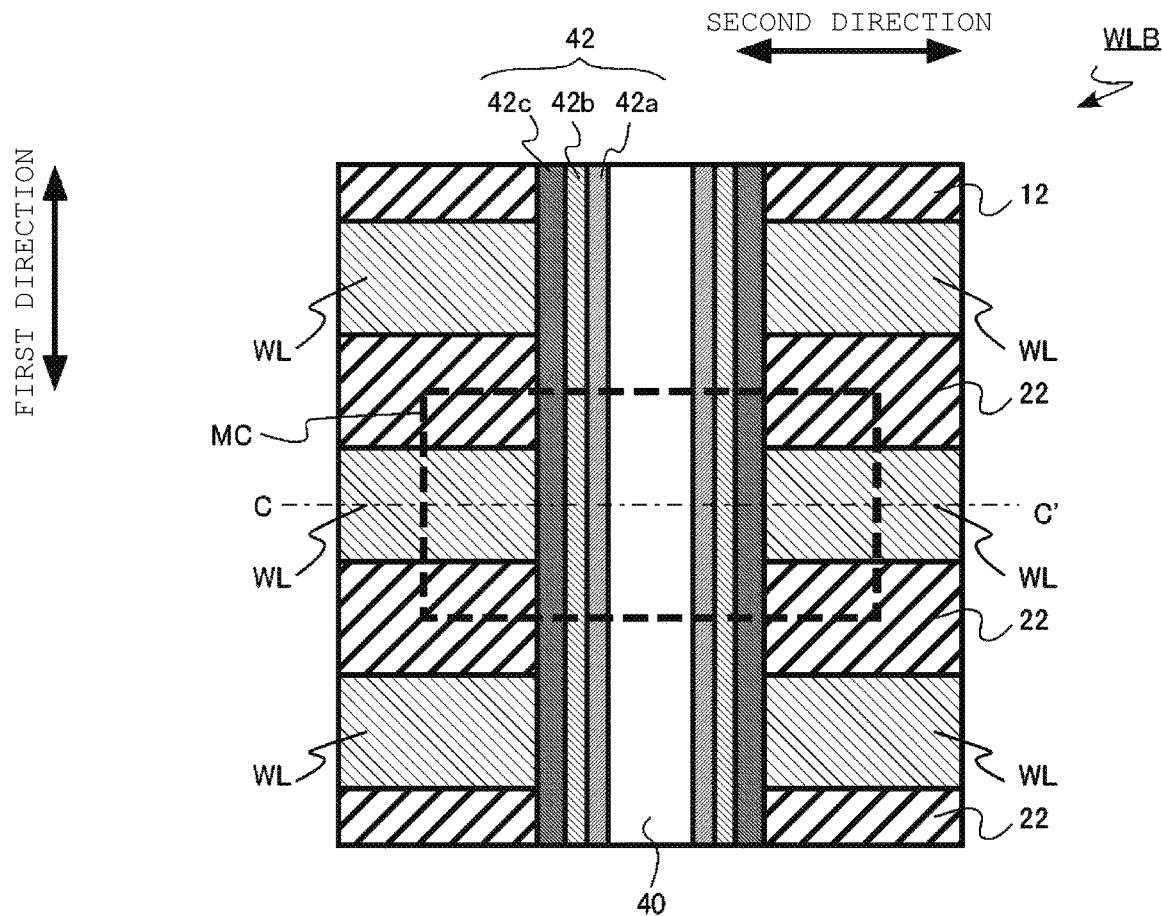
FIGS. 4A and 4B illustrate schematic cross-sectional views of parts of the semiconductor memory device according to the first embodiment.

The memory cell array 26 includes a plurality of word line blocks WLB, a plurality of channel layers 40, and a charge storage layer 42 (which is not shown in FIGS. 1 and 2, but see, e.g., FIG. 4A). Each of the plurality of word line blocks WLB includes a plurality of word lines WL.

The memory cell array 26 includes a first region 26a, a second region 26b, a third region 26c, a fourth region 26d, a fifth region 26e, a sixth region 26f, a seventh region 26g, and an eighth region 26h.

The element isolation insulating layer 28 is an example of a first insulating layer.

The word line block WLB is an example of a stacked body. The channel layer 40 is an example of a semiconductor layer. The word line WL is an example of a gate electrode layer.

The plurality of channel layers 40 include a first channel layer 40a and a second channel layer 40b. The channel layers 40 are examples of semiconductor layers. The first channel layer 40a is an example of a first semiconductor layer. The second channel layer 40b is an example of a second semiconductor layer.

As shown in FIG. 1, the control chip 101 and the memory chip 102 are bonded at a sticking interface S.

The control chip 101 controls the memory chip 102.

The first semiconductor substrate 10 is, for example, single crystal silicon.

The control circuit 16 is provided between the first semiconductor substrate 10 and the memory chip 102. The control circuit 16 includes semiconductor elements such as a plurality of transistors and a multilayer wiring layer that electrically connects the semiconductor elements.

The control circuit 16 includes a first sense amplifier circuit 18a, a second sense amplifier circuit 18b, a third sense amplifier circuit 18c, and a fourth sense amplifier circuit 18d. The first sense amplifier circuit 18a, the second sense amplifier circuit 18b, the third sense amplifier circuit 18c, and the fourth sense amplifier circuit 18d amplify data read from the memory cell of the memory chip 102 and detect the memory cell data as read.

The first interlayer region 12 is provided on the memory chip 102 side of the first semiconductor substrate 10. The first interlayer region 12 provides electrical insulation of semiconductor elements such as a plurality of transistors of the control circuit 16 and the multilayer wiring layer. The first interlayer region 12 contains, for example, silicon oxide.

The first metal pads 14a to 14f are provided on the memory chip 102 side of the first interlayer region 12. The first metal pads 14a to 14f are provided in the first interlayer region 12.

A control circuit 16 is provided between the first semiconductor substrate 10 and the first metal pads 14a to 14f.

The first metal pads 14a to 14f are electrically connected to the control circuit 16. The first metal pad 14a is electrically connected to the first sense amplifier circuit 18a. The first metal pad 14b is electrically connected to the second sense amplifier circuit 18b. The first metal pad 14c is electrically connected to the third sense amplifier circuit 18c. The first metal pad 14d is electrically connected to the fourth sense amplifier circuit 18d.

The first metal pads 14a to 14f are in contact with the second metal pads 24a to 24f. The first metal pads 14a to 14f electrically connect the control chip 101 and the memory chip 102.

The first metal pads 14a to 14f contains, for example, copper (Cu). The first metal pads 14a to 14f are, for example, copper (Cu) pads.

As shown in FIG. 1, the memory chip 102 includes the memory cell array 26 between the second semiconductor substrate 20 and the control chip 101. A plurality of memory cells are three-dimensionally stacked in the memory cell array 26. A large-capacity flash memory 100 can be implemented by arranging a plurality of memory cells three-dimensionally.

The second semiconductor substrate 20 includes a first surface P1 and a second surface P2. The first surface P1 is a surface on the side of the memory cell array 26, and the second surface P2 is a surface on the side opposite to the memory cell array 26.

The second semiconductor substrate 20 is, for example, a single crystal silicon layer.

As shown in FIG. 1, the first bit line BL1, the second bit line BL2, the third bit line BL3, and the fourth bit line BL4 are provided between the memory cell array 26 and the control chip 101. The bit lines BL1 to BL4 extend in the second direction. The bit lines BL1 to BL4 are separated from each other with a gap therebetween.

The bit line BL is used to read data from the memory cell of the memory cell array 26. The bit line BL is, for example, a metal layer. The bit line BL is formed of, for example, tungsten or copper.

As shown in FIG. 2, the memory chip 102 has eight planes. The memory chip 102 includes the first plane PL1, the second plane PL2, the third plane PL3, the fourth plane PL4, the fifth plane PL5, the sixth plane PL6, the seventh plane PL7, and the eighth plane PL8.

A plane is a range where the simultaneous execution of different commands is restricted for different memory cells belonging thereto in terms of the memory operation. Different commands cannot be executed simultaneously on different memory cells belonging to the same plane. For example, two different commands among a write command, a read command, and an erase command cannot be simultaneously executed for different memory cells belonging to the same plane.

For example, different commands cannot be executed simultaneously on different memory cells belonging to the first plane PL1. On the other hand, different commands can be executed for the memory cell belonging to the first plane PL1 and the memory cell belonging to the second plane PL2. Therefore, it is possible to increase the bandwidth of the flash memory by increasing the number of planes.

The first plane PL1, the second plane PL2, the third plane PL3, and the fourth plane PL4 are arranged side by side in the second direction. The memory cell array 26 is arranged across the boundary between the first plane PL1 and the second plane PL2, the boundary between the second plane PL2 and the third plane PL3, and the boundary between the third plane PL3 and the fourth plane PL4. In the memory cell array 26, the regions belonging to the first plane PL1, the second plane PL2, the third plane PL3, and the fourth plane PL4 are the first region 26a, the second region 26b, the third region 26c, and the fourth region 26d, respectively.

The fifth plane PL5, the sixth plane PL6, the seventh plane PL7, and the eighth plane PL8 are arranged side by side in the second direction. The memory cell array 26 is arranged across the boundary between the fifth plane PL5 and the sixth plane PL6, the boundary between the sixth plane PL6 and the seventh plane PL7, and the boundary between the seventh plane PL7 and the eighth plane PL8. In the memory cell array 26, the regions belonging to the fifth plane PL5, the sixth plane PL6, the seventh plane PL7, and the eighth plane PL8 are the fifth region 26e, the sixth region 26f, the seventh region 26g, and the eighth region 26h, respectively.

The word line contact region WLC is provided in a third direction of the memory cell array 26. The third direction is a direction perpendicular to the first direction and the second direction. A structure for obtaining an electrical connection to the word line WL is formed in the word line contact region WLC.

The terminal pad region TP is provided in the second direction of the first plane PL1, the second plane PL2, the third plane PL3, the fourth plane PL4, the fifth plane PL5, the sixth plane PL6, the seventh plane PL7, and the eighth plane PL8. A structure for obtaining an electrical connection to the control chip 101 is formed in the terminal pad region TP.

The through via 32 and the terminal pad 34 shown in FIG. 1 are provided in the terminal pad region TP.

Figure 3:
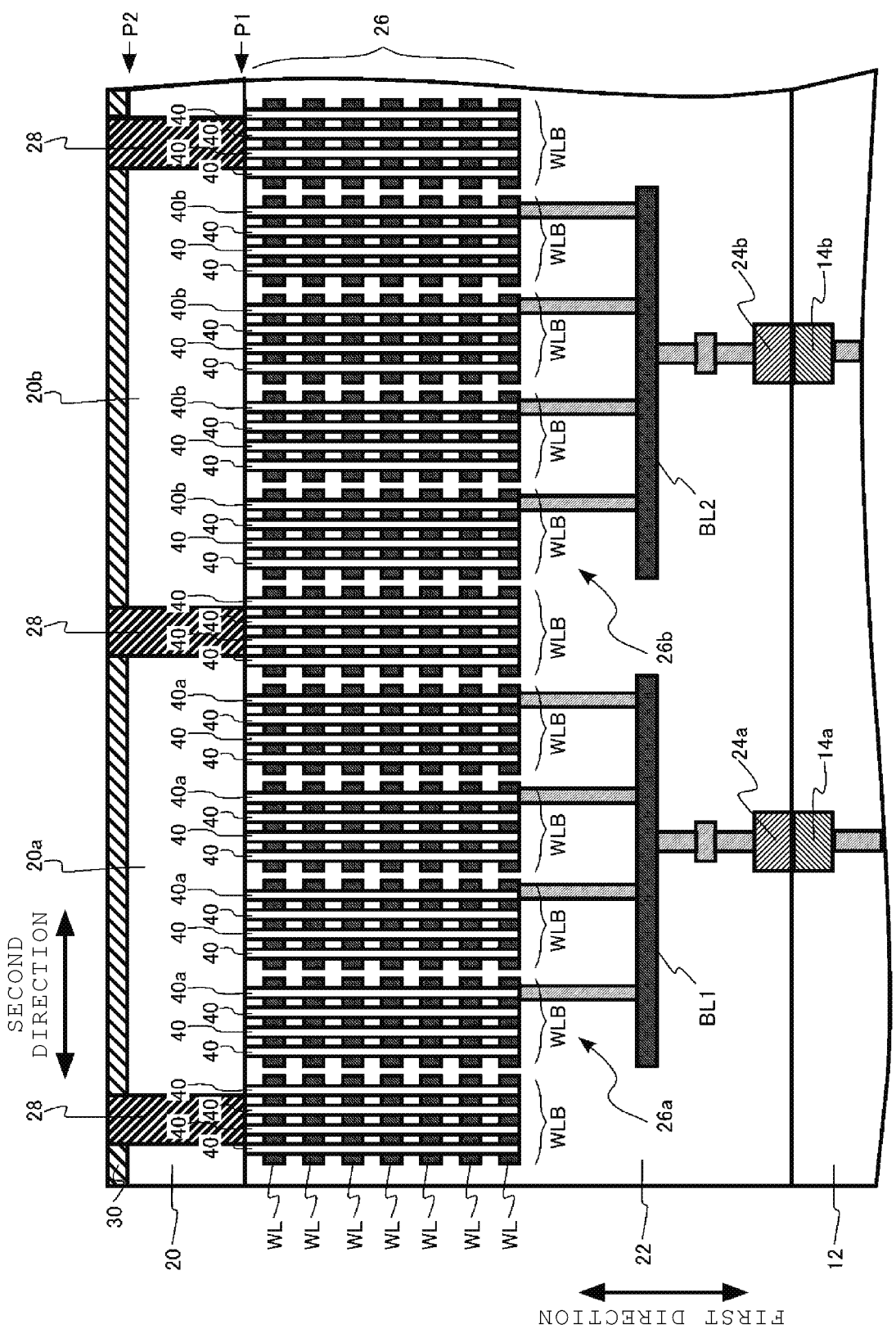
FIG. 3 illustrates a schematic cross-sectional view of apart of the semiconductor memory device according to the first embodiment.

FIG. 3 illustrates a schematic cross-sectional view of a part of the semiconductor memory device according to the first embodiment. FIG. 3 illustrates an enlarged view of a part of FIG. 1.

The memory cell array 26 includes a plurality of word line blocks WLB. The word line block WLB includes a plurality of word lines WL that are repeatedly arranged apart from each other in the first direction. The first direction is a normal line direction of the first surface P1 of the second semiconductor substrate 20.

One word line block WLB constitutes, for example, a block, which is an erase unit in the memory operation. However, the block is not limited thereto, and the block may include a plurality of word line blocks WBL.

Each word line WL functions as a gate electrode layer of a memory cell transistor in the memory cell array 26. The word lines WL are electrically separated from each other by the second interlayer region 22. The word lines WL are divided between the word line blocks WLB.

The word line WL is a conductive layer. The word line WL is, for example, a metal layer. The word line WL is formed of, for example, tungsten.

The word line blocks WLB are repeatedly arranged at constant intervals in the second direction perpendicular to the first direction.

It is possible to provide a plate-like conductive layer (not shown) between the word line blocks WLB. For example, by electrically connecting the conductive layer to the second semiconductor substrate 20, it is possible to obtain electrical conduction from the control chip 101 side of the memory cell array 26 to the second semiconductor substrate 20.

The memory cell array 26 includes a plurality of channel layers 40. The channel layer 40 is provided in the word line block WLB. The channel layer 40 extends in the first direction. The channel layers 40 are regularly arranged in the plane perpendicular to the first direction.

The one end of the channel layer 40 is electrically connected to the second semiconductor substrate 20. The other end of the channel layer 40 is electrically connected to the bit line BL. The channel layer 40 functions as a channel region of the memory cell transistor in the memory cell array 26.

The channel layer 40 is a semiconductor. The channel layer 40 is, for example, a polycrystalline silicon layer.

The first bit line BL1 extends in the second direction. The first bit line BL1 is electrically connected to the first channel layer 40a, which is at least one of the plurality of channel layers 40. The first channel layer 40a is electrically connected to the first plate region 20a.

Also, the second bit line BL2 extends in the second direction. The second bit line BL2 is electrically connected to the second channel layer 40b which is at least one of the plurality of channel layers 40. The second channel layer 40b is electrically connected to the second plate region 20b.

Figure 4B:
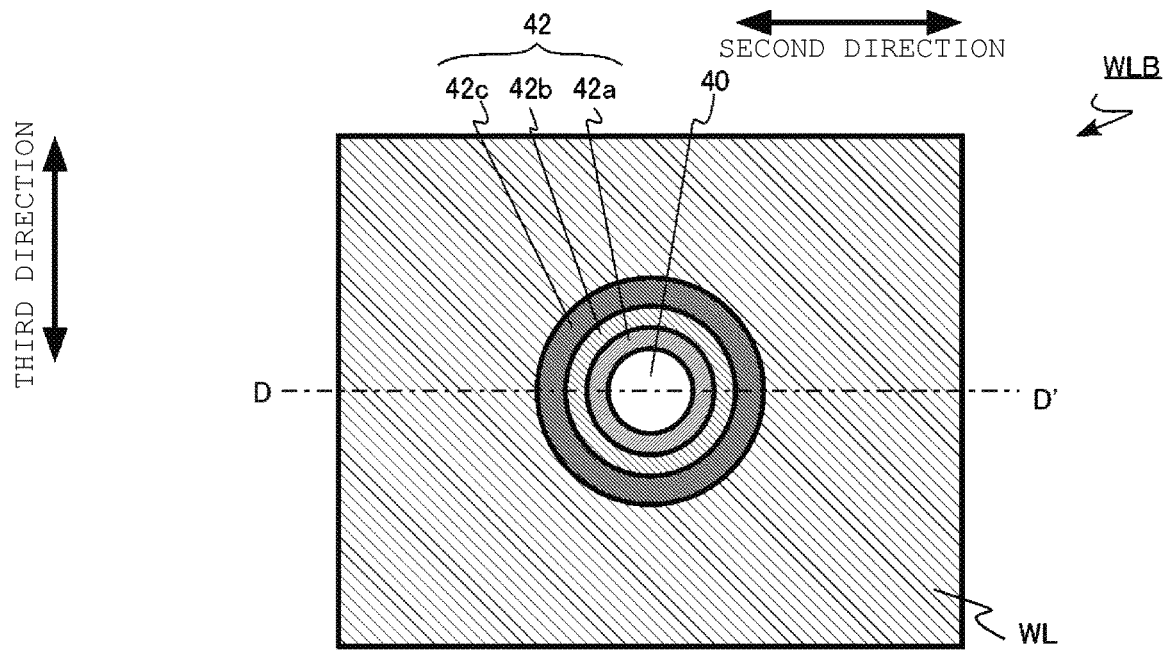

FIGS. 4A and 4B illustrate schematic cross-sectional views of a part of the semiconductor memory device according to the first embodiment. Specifically, FIGS. 4A and 4B illustrate schematic cross-sectional views of a part of the memory cell array 26. More specifically, FIGS. 4A and 4B illustrate schematic cross-sectional views of a part of one word line block WLB. FIG. 4A illustrates a DD' cross section of FIG. 4B, and FIG. 4B illustrates a CC' cross section of FIG. 4A. In FIG. 4A, a region surrounded by a dotted frame is one memory cell MC.

The charge storage layer 42 is provided between the word line WL and the channel layer 40. The charge storage layer 42 includes, for example, a tunnel insulating film 42a, a charge trap film 42b, and a block insulating film 42c. The tunnel insulating film 42a, the charge trap film 42b, and the block insulating film 42c are, for example, a silicon oxide film, a silicon nitride film, and a silicon oxide film, respectively.

The threshold voltage of the transistor of the memory cell MC changes according to the amount of charge stored in the charge storage layer 42. By utilizing this change in threshold voltage, one memory cell MC can store data.

The channel layer 40 has, for example, a cylindrical shape. The channel layer 40 may have, for example, a cylindrical shape provided with an insulating layer inside.

Figure 5:
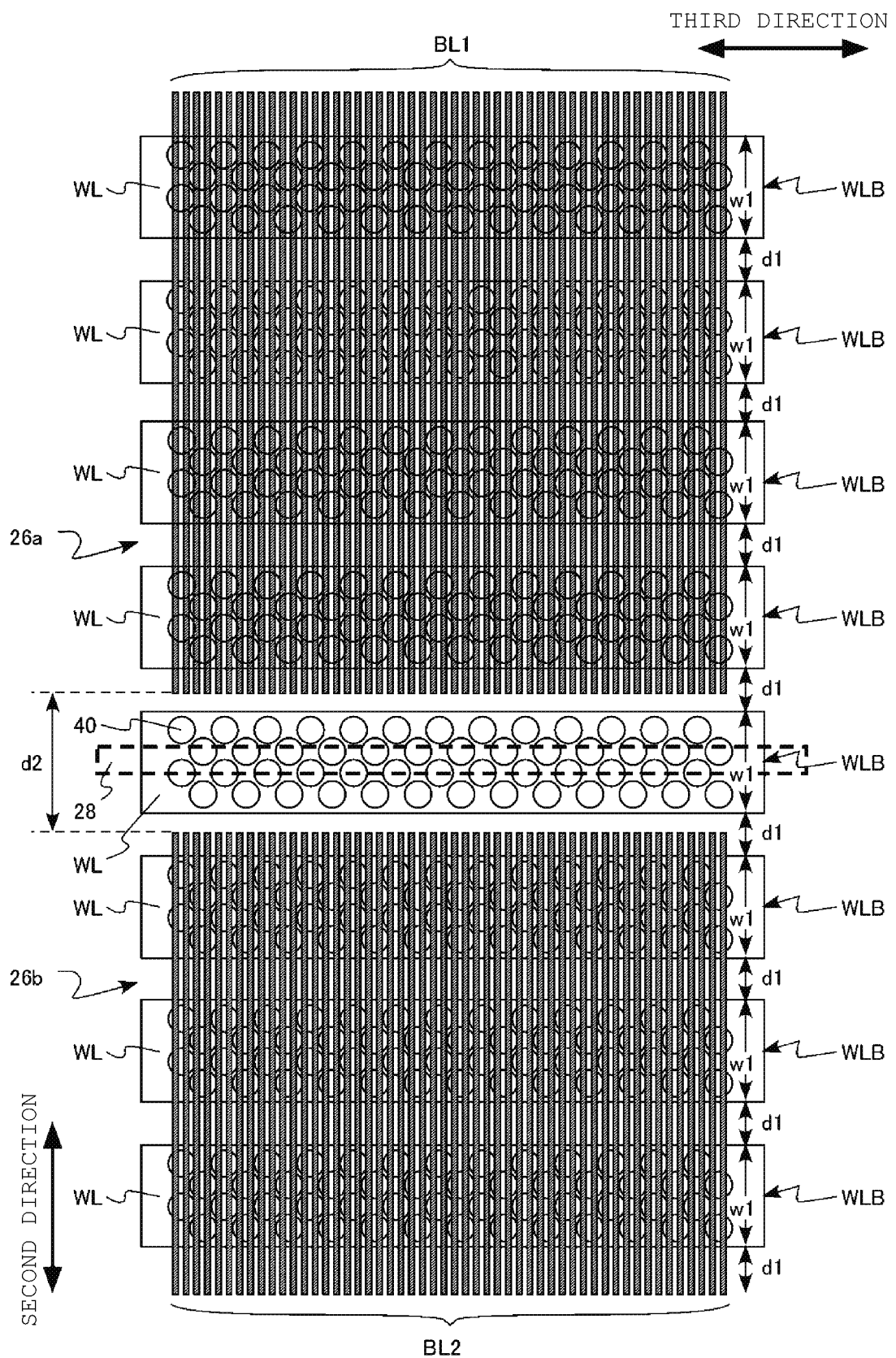
FIG. 5 is a schematic diagram of the semiconductor memory device according to the first embodiment.

FIG. 5 is a schematic diagram of the semiconductor memory device according to the first embodiment. FIG. 5 shows the positional relationship of the word line WL, the word line block WLB, the channel layer 40, the element isolation insulating layer 28, the first bit line BL1, and the second bit line BL2 when viewed from the plane perpendicular to the first direction.

FIG. 5 illustrates an enlarged view of the region X in FIG. 2. FIG. 5 is a diagram including the boundary between the first plane PL1 and the second plane PL2.

The word line block WLB has a first width (w1 in FIG. 5) in the second direction. The word line blocks WLB are repeatedly arranged at a first interval (d1 in FIG. 5) in the second direction. The word line blocks WLB are arranged in the second direction at a constant cycle, that is, a cycle of w1+d1.

The periodic arrangement of the word line blocks WLB is maintained from one end of the memory cell array 26 in the second direction to the other end. For example, from the end of the first plane PL1 to the end of the fourth plane PL4, the periodic arrangement of the word line blocks WLB is maintained without interruption between the planes.

The channel layers 40 are regularly arranged in a plane perpendicular to the first direction. The channel layer 40 is in the word line block WLB.

The first bit line BL1 and the second bit line BL2 extend in the second direction. The second bit line BL2 is on an extension line of the first bit line BL1. The second bit line BL2 and the first bit line BL1 are separated from each other. The second bit line BL2 and the first bit line BL1 are physically and electrically divided.

One of the plurality of word line blocks WLB is located in the portion between the first bit line BL1 and the second bit line BL2, which are divided. One word line block WLB exists between the portion between the first bit line BL1 and the second bit line BL2, and the second semiconductor substrate 20.

The channel layer 40 in the word line block WLB located in the portion between the first bit line BL1 and the second bit line BL2 is not electrically connected to any of the first bit line BL1 and the second bit line BL2. The memory cells in the word line block WLB located in the portion between the first bit line BL1 and the second bit line BL2 are so-called dummy cells that do not operate as memory cells.

The distance (d2 in FIG. 5) between the first bit line BL1 and the second bit line BL2 is, for example, smaller than three times the first width w1 of the word line block WLB. The distance (d2 in FIG. 5) between the first bit line BL1 and the second bit line BL2 is, for example, smaller than twice the first width w1 of the word line block WLB. The distance d2 may be referred to as a length of the gap between the first bit line BL1 and the second bit line BL2.

The first bit line BL1 belongs to the first plane PL1. The second bit line BL2 belongs to the second plane PL2.

The first bit line BL1 is electrically connected to the first sense amplifier circuit 18a of the control chip 101. The second bit line BL2 is electrically connected to the second sense amplifier circuit 18b of the control chip 101.

The element isolation insulating layer 28 is provided on the side of the second semiconductor substrate 20 of the word line block WLB located in the portion between the first bit line BL1 and the second bit line BL2. For example, at least apart of the channel layer 40 in the word line block WLB located in the portion between the first bit line BL1 and the second bit line BL2 is in contact with the element isolation insulating layer 28.

Figure 6:
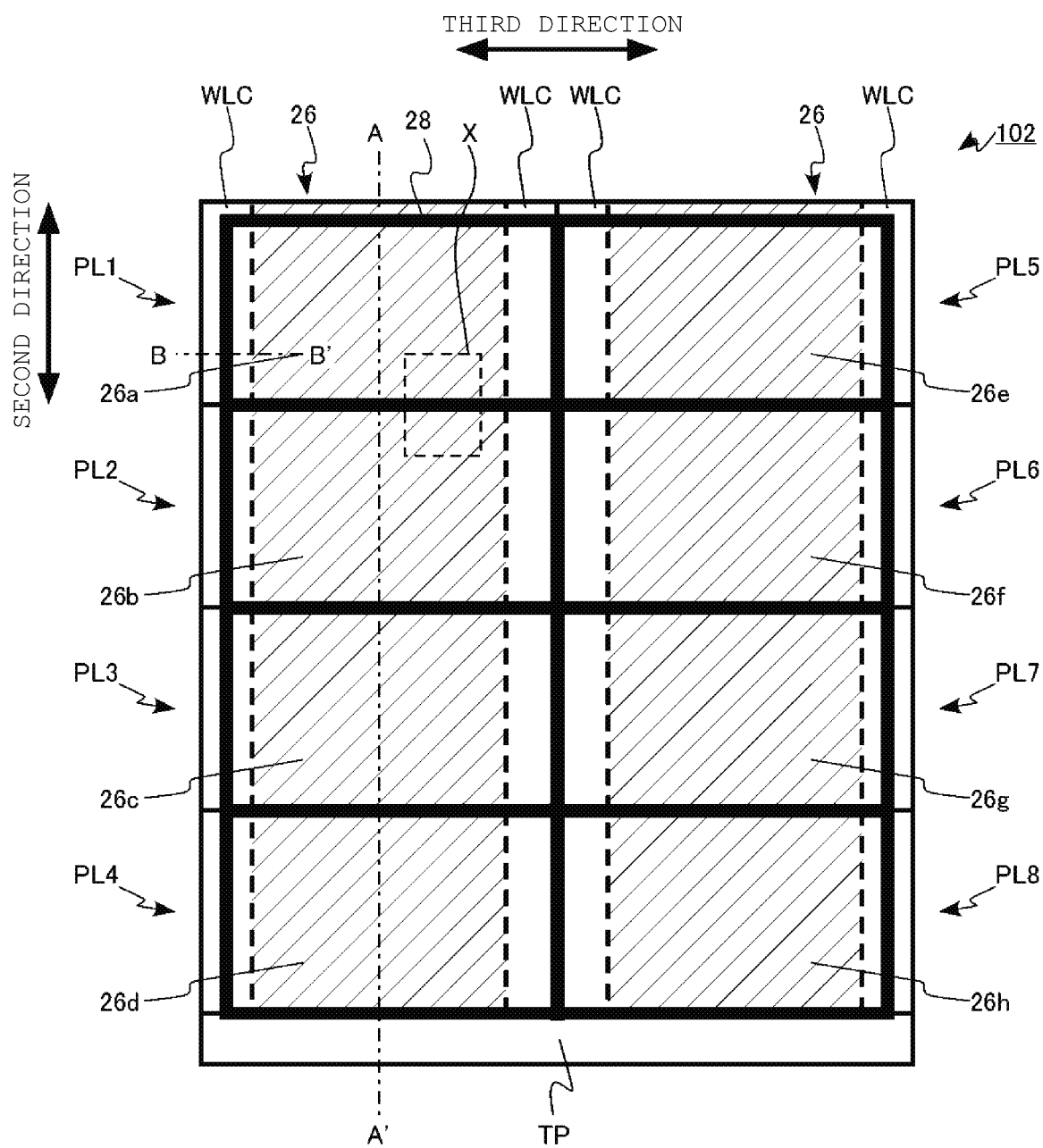
FIG. 6 is a layout diagram of the semiconductor memory device according to the first embodiment.

FIG. 6 is a layout diagram of the semiconductor memory device according to the first embodiment. FIG. 6 shows the arrangement of the element isolation insulating layer of the memory chip 102 of the flash memory 100.

The element isolation insulating layer 28 surrounds the first region 26a, the second region 26b, the third region 26c, the fourth region 26d, the fifth region 26e, the sixth region 26f, the seventh region 26g, and the eighth region 26h of the memory cell array 26. The element isolation insulating layer 28 is provided in a lattice shape.

As shown in FIG. 1, the second semiconductor substrate 20 of the memory chip 102 includes the first plate region 20a, the second plate region 20b, the third plate region 20c, and the fourth plate region 20d. The first plate region 20a and the second plate region 20b, the second plate region 20b and the third plate region 20c, and the third plate region 20c and the fourth plate region 20d are separated by an element isolation insulating layer 28. The first plate region 20a and the second plate region 20b, the second plate region 20b and the third plate region 20c, and the third plate region 20c and the fourth plate region 20d are physically and electrically separated by the element isolation insulating layer 28.

The element isolation insulating layer 28 is continuously provided from the first surface P1 of the second semiconductor substrate 20 on the memory cell array 26 side to the second surface P2 of the second semiconductor substrate 20 on the opposite side of the memory cell array 26. The element isolation insulating layer 28 penetrates the second semiconductor substrate 20.

The element isolation insulating layer 28 is an insulator. The element isolation insulating layer 28 is, for example, a silicon oxide layer.

The first plate region 20a, the second plate region 20b, the third plate region 20c, and the fourth plate region 20d belong to the first plane PL1, the second plane PL2, the third plane PL3, and the fourth plane PL4, respectively, in terms of the memory operation.

As shown in FIG. 3, the channel layer 40 in the first region 26a of the memory cell array 26 is electrically connected to the first plate region 20a. The first channel layer 40a is provided in the channel layer 40 electrically connected to the first plate region 20a.

The channel layer 40 in the second region 26b of the memory cell array 26 is electrically connected to the second plate region 20b. The second channel layer 40b is provided in the channel layer 40 electrically connected to the second plate region 20b.

As shown in FIG. 1, the second metal pads 24a to 24f are provided on the memory chip 102 side of the second interlayer region 22. The second metal pads 24a to 24f are provided in the second interlayer region 22.

The memory cell array 26 is provided between the second semiconductor substrate 20 and the second metal pads 24a to 24f.

The second interlayer region 22 is provided on the control chip 101 side of the second semiconductor substrate 20. The second semiconductor substrate 20 and the control chip 101 sandwich the second interlayer region 22.

The second interlayer region 22 provides electrical insulation of the memory cell array 26. The second interlayer region 22 includes, for example, silicon oxide.

The second metal pads 24a to 24f are electrically connected to the memory cell array 26. The second metal pad 24a is electrically connected to the first bit line BL1. The second metal pad 24b is electrically connected to the second bit line BL2. The second metal pad 24c is electrically connected to the third bit line BL3. The second metal pad 24d is electrically connected to the fourth bit line BL4.

The second metal pads 24a to 24f are in contact with the first metal pads 14a to 14f, respectively. The second metal pad 24a is in contact with the first metal pad 14a. The second metal pad 24b is in contact with the first metal pad 14b. The second metal pad 24c is in contact with the first metal pad 14c. The second metal pad 24d is in contact with the first metal pad 14d.

The second metal pads 24a to 24f are electrically connected to the first metal pads 14a to 14f, respectively. The second metal pad 24a is electrically connected to the first metal pad 14a. The second metal pad 24b is electrically connected to the first metal pad 14b. The second metal pad 24c is electrically connected to the first metal pad 14c. The second metal pad 24d is electrically connected to the first metal pad 14d.

The second metal pads 24a to 24f electrically connect the memory chip 102 and the control chip 101.

The second metal pads 24a to 24f contain, for example, copper (Cu). The second metal pads 24a to 24f are, for example, copper (Cu) pads.

Figure 7:
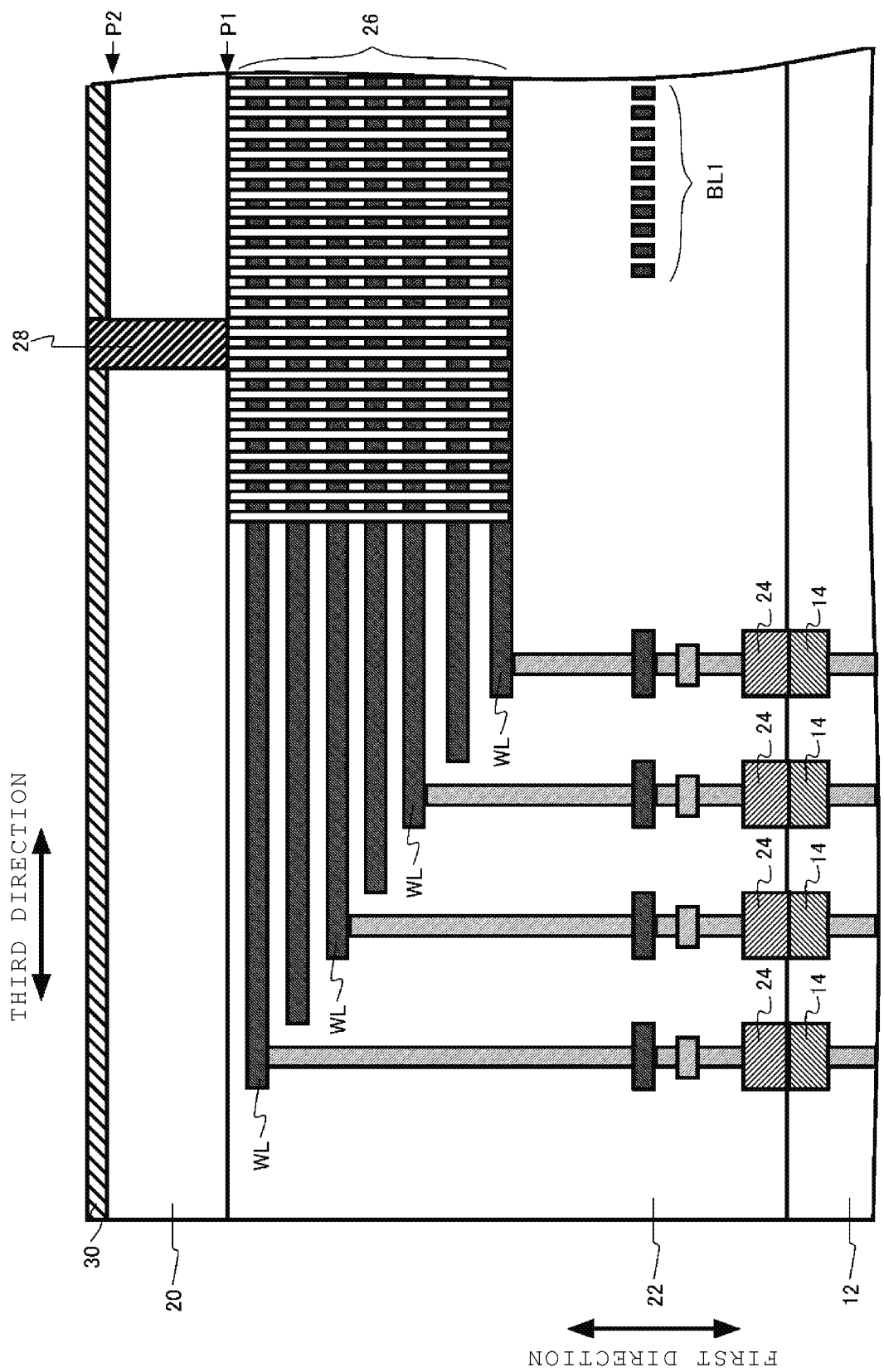
FIG. 7 illustrates a schematic cross-sectional view of apart of the semiconductor memory device according to the first embodiment.

FIG. 7 illustrates a schematic cross-sectional view of apart of the semiconductor memory device according to the first embodiment. FIG. 7 illustrates a BB' cross section of FIG. 2. FIG. 7 illustrates a cross-sectional view of the word line contact region WLC.

In the word line contact region WLC, the word lines WL extending from the memory cell array 26 in the third direction form a staircase structure. The conductive layer extending from the second metal pad 24 electrically connects the second metal pad 24 and the word line WL. The second metal pads 24 are in contact with the first metal pads 14, respectively.

The element isolation insulating layer 28 is provided on the second semiconductor substrate 20 side of the memory cell array 26. The position where the element isolation insulating layer 28 is provided is not particularly limited as long as the position is on the chip end side of the channel layer 40 to which the bit line BL is connected. For example, the position where the element isolation insulating layer 28 is provided may be on the second semiconductor substrate 20 side of the staircase structure of the word lines WL.

The back surface insulating layer 30 is provided on the second semiconductor substrate 20. The back surface insulating layer 30 is provided in contact with the second surface P2 of the second semiconductor substrate 20. The back surface insulating layer 30 is, for example, silicon oxide.

The passivation film 36 is provided on the back surface insulating layer 30. The passivation film 36 is provided in contact with the back surface insulating layer 30. The passivation film 36 is, for example, polyimide.

Next, an example of a method for manufacturing the semiconductor memory device according to the first embodiment will be described. FIGS. 8, 9, 10, 11, 12, 13, 14, and 15 are schematic cross-sectional diagrams to explain the method for manufacturing the semiconductor memory device according to the first embodiment.

Figure 8:
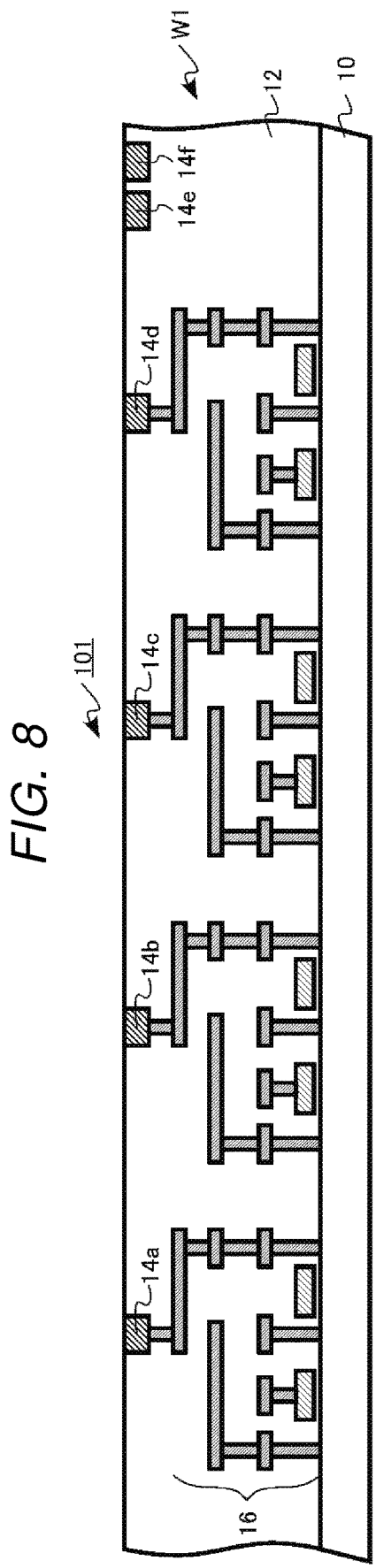
FIGS. 8-15 are schematic cross-sectional diagrams to explain aspects of a method for manufacturing a semiconductor memory device according to a first embodiment.

First, a first wafer W1 having a region which will become a plurality of control chips 101 is manufactured on the first semiconductor substrate 10 (FIG. 8). The control circuit 16 is formed in a region that will become the control chip 101. The first metal pads 14a to 14f are exposed on the surface of the first wafer W1.

Figure 9:
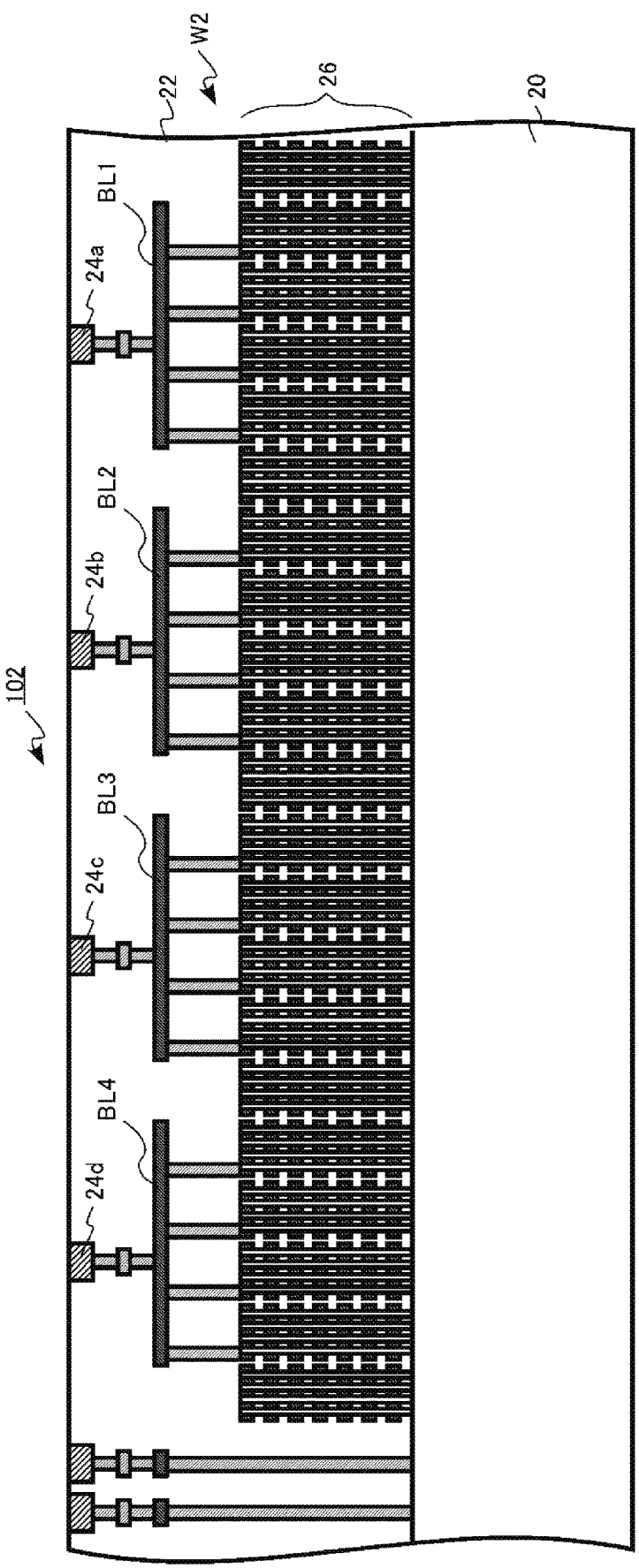

Next, a second wafer W2 having a region which will become a plurality of memory chips 102 is manufactured on the second semiconductor substrate 20 (FIG. 9). The memory cell array 26 is formed in a region which will become the memory chip 102. The second metal pads 24a to 24f are exposed on the surface of the second wafer W2.

Figure 10:
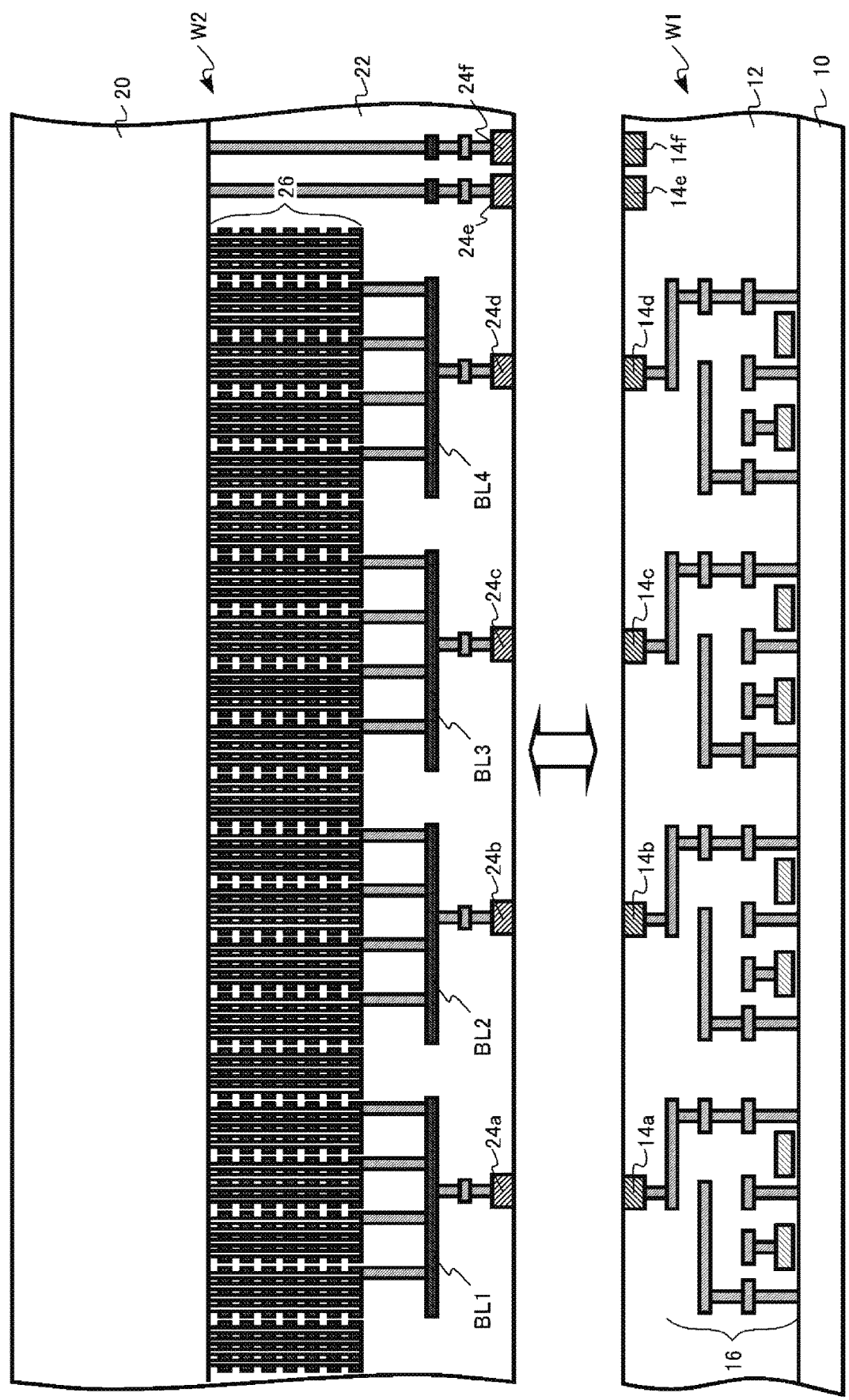
Figure 11:
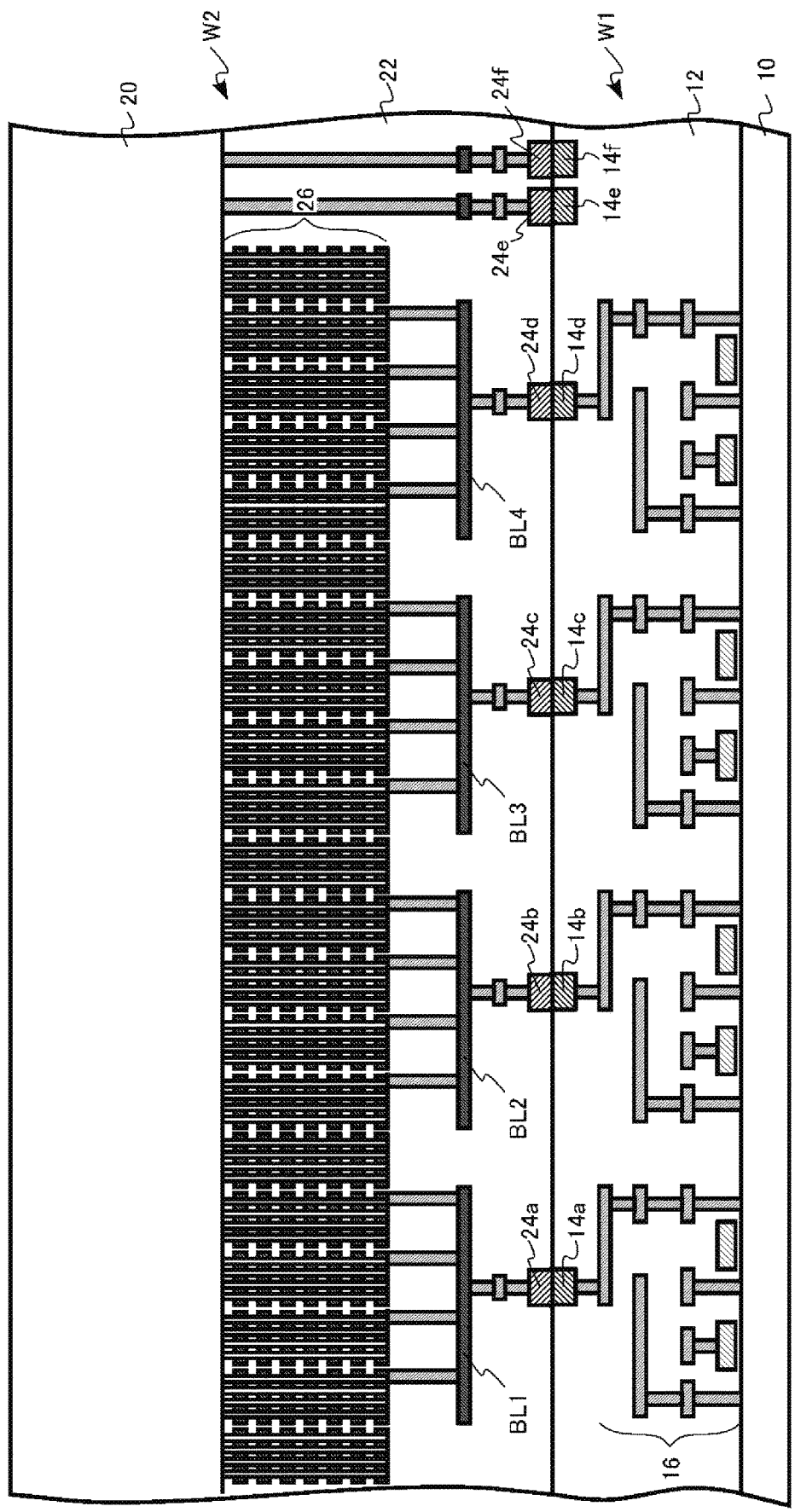

Next, the first wafer W1 and the second wafer W2 are attached by mechanical pressure (FIGS. 10 and 11). The first wafer W1 and the second wafer W2 are attached so that the first metal pads 14a to 14f and the second metal pads 24a to 24f are in contact with each other. Next, the first wafer W1 and the second wafer W2 are annealed. The annealing temperature is 400° C., for example. The first wafer W1 and the second wafer W2 are bonded by the annealing.

Figure 12:
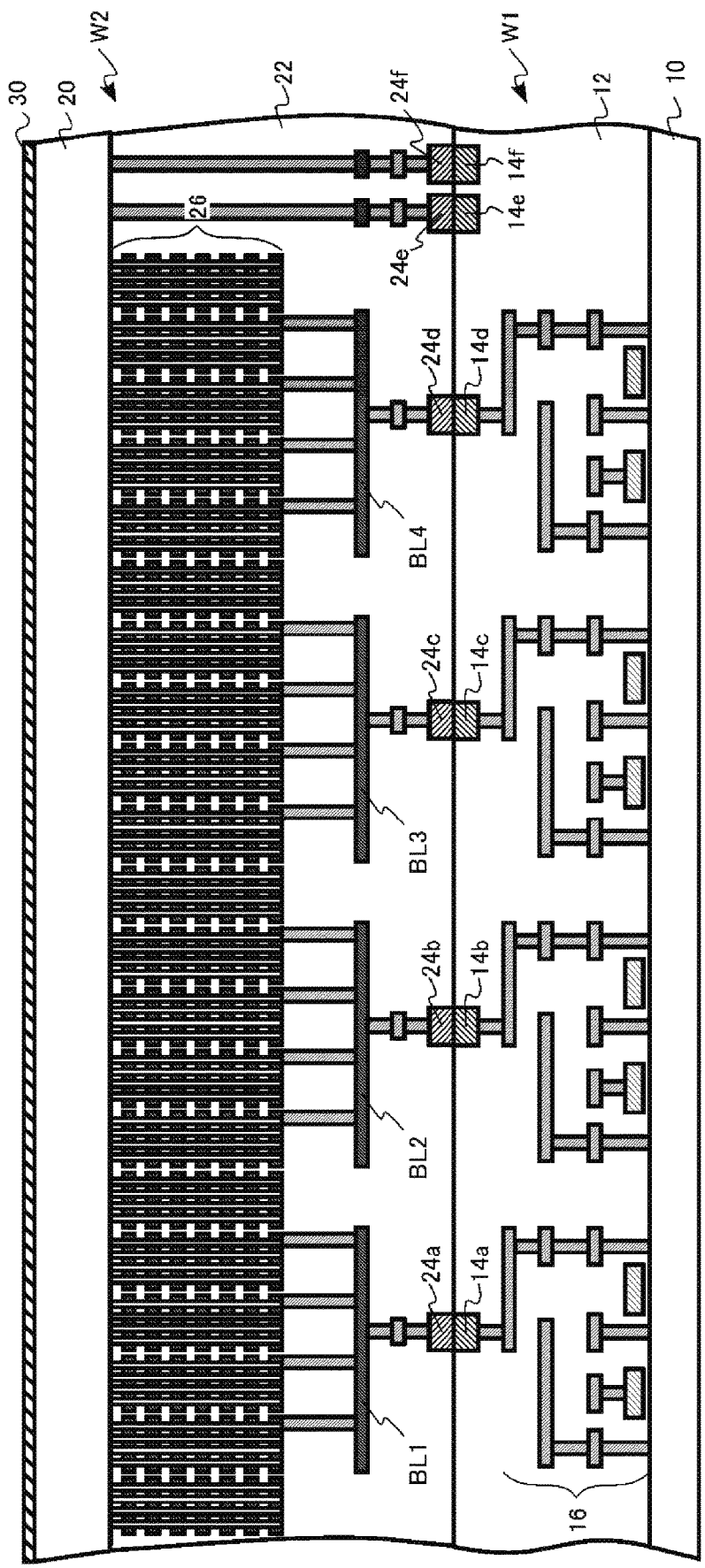

Next, after thinning the second semiconductor substrate 20, the back surface insulating layer 30 is formed (FIG. 12). The thinning of the second semiconductor substrate 20 is performed by using, for example, the chemical mechanical polishing method (CMP method). The back surface insulating layer 30 is formed by using, for example, the deposition of a film by the chemical vapor deposition method (CVD method).

Figure 13:
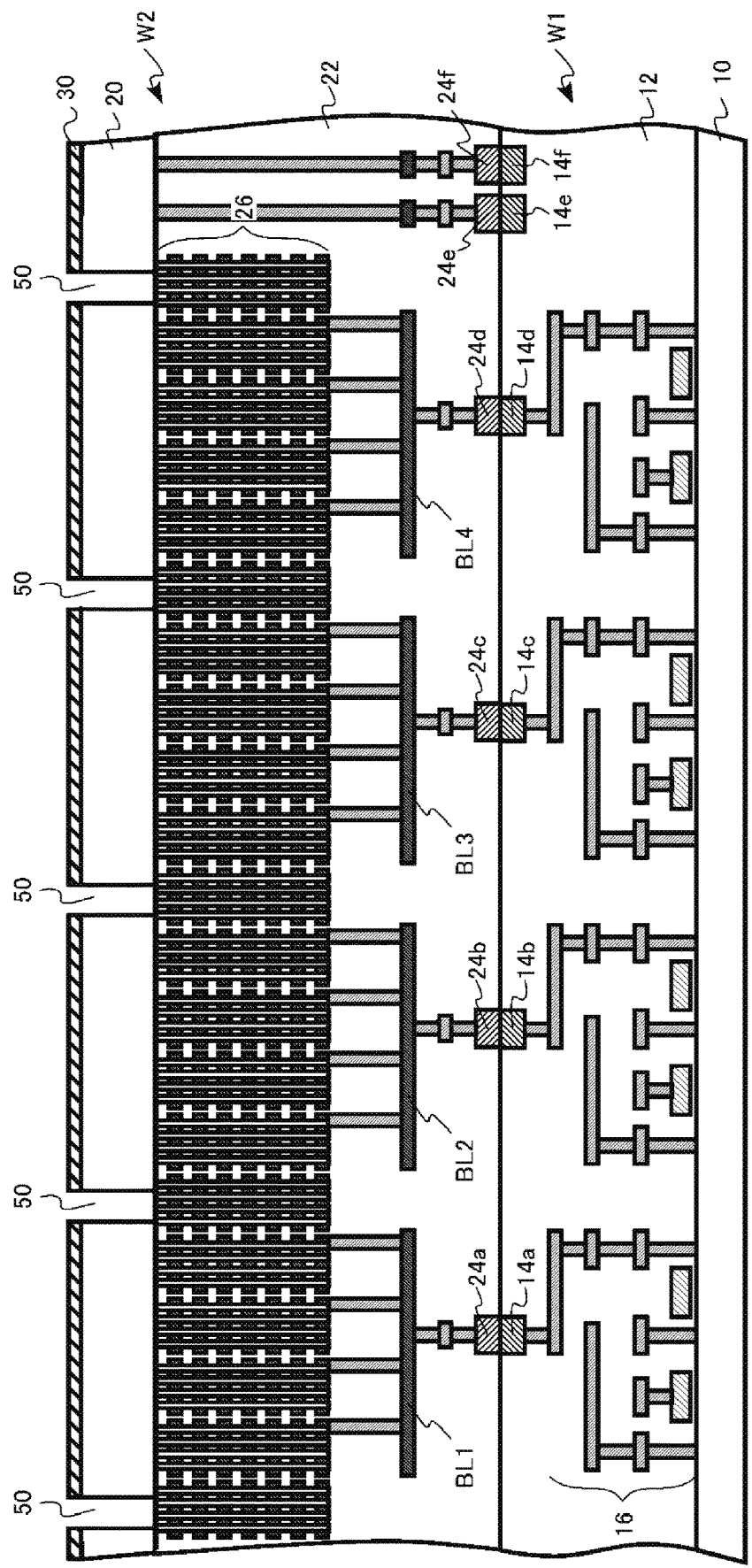

Next, an opening 50 is formed in the second semiconductor substrate 20 (FIG. 13). The opening 50 is formed by, for example, patterning by the lithography method and etching by the reactive ion etching method (RIE method).

Figure 14:
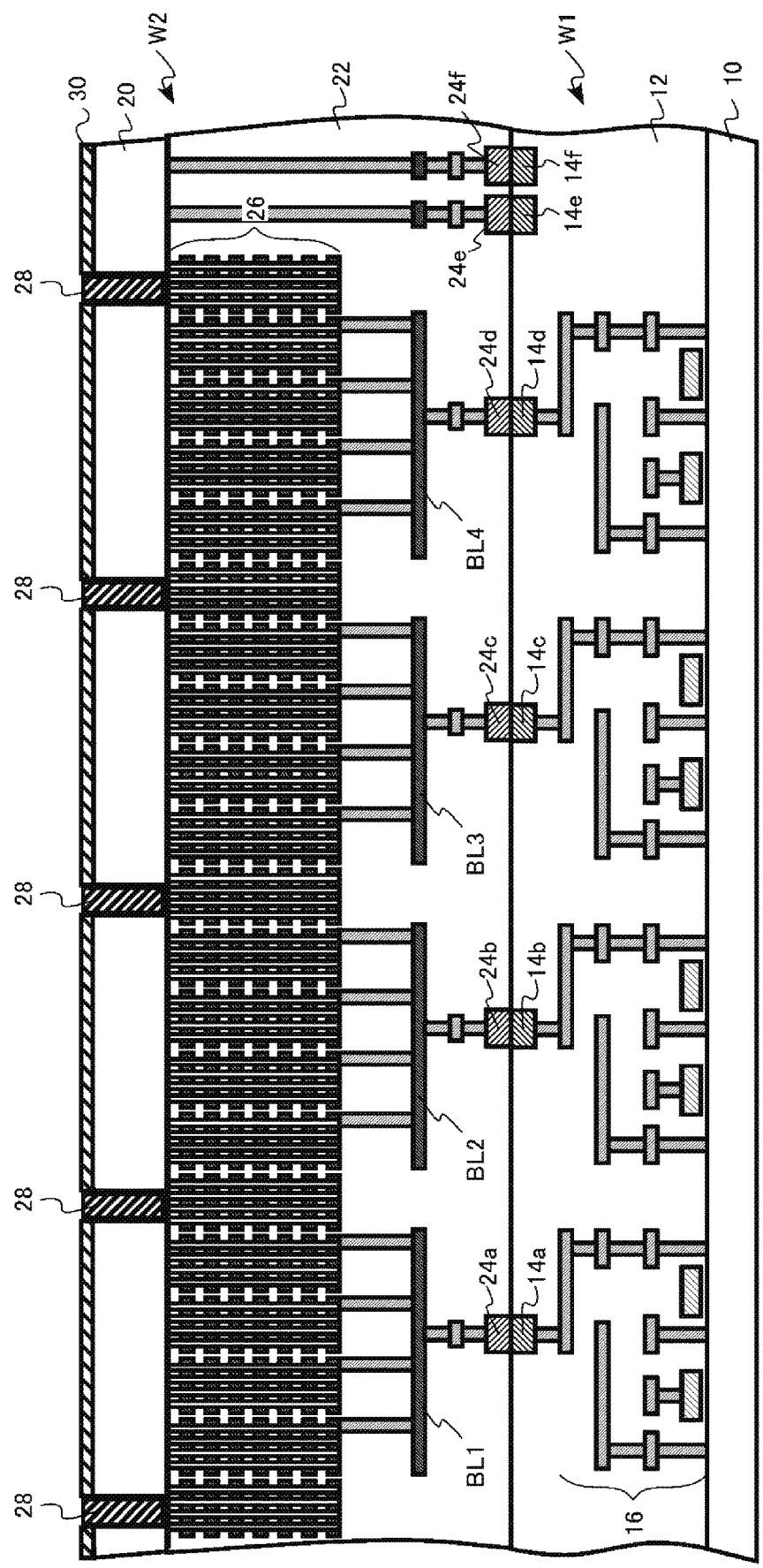

Next, the element isolation insulating layer 28 is formed in the opening 50 (FIG. 14). The element isolation insulating layer 28 is formed by, for example, the deposition of a film by the CVD method and planarization of the film by the CMP method.

Figure 15:
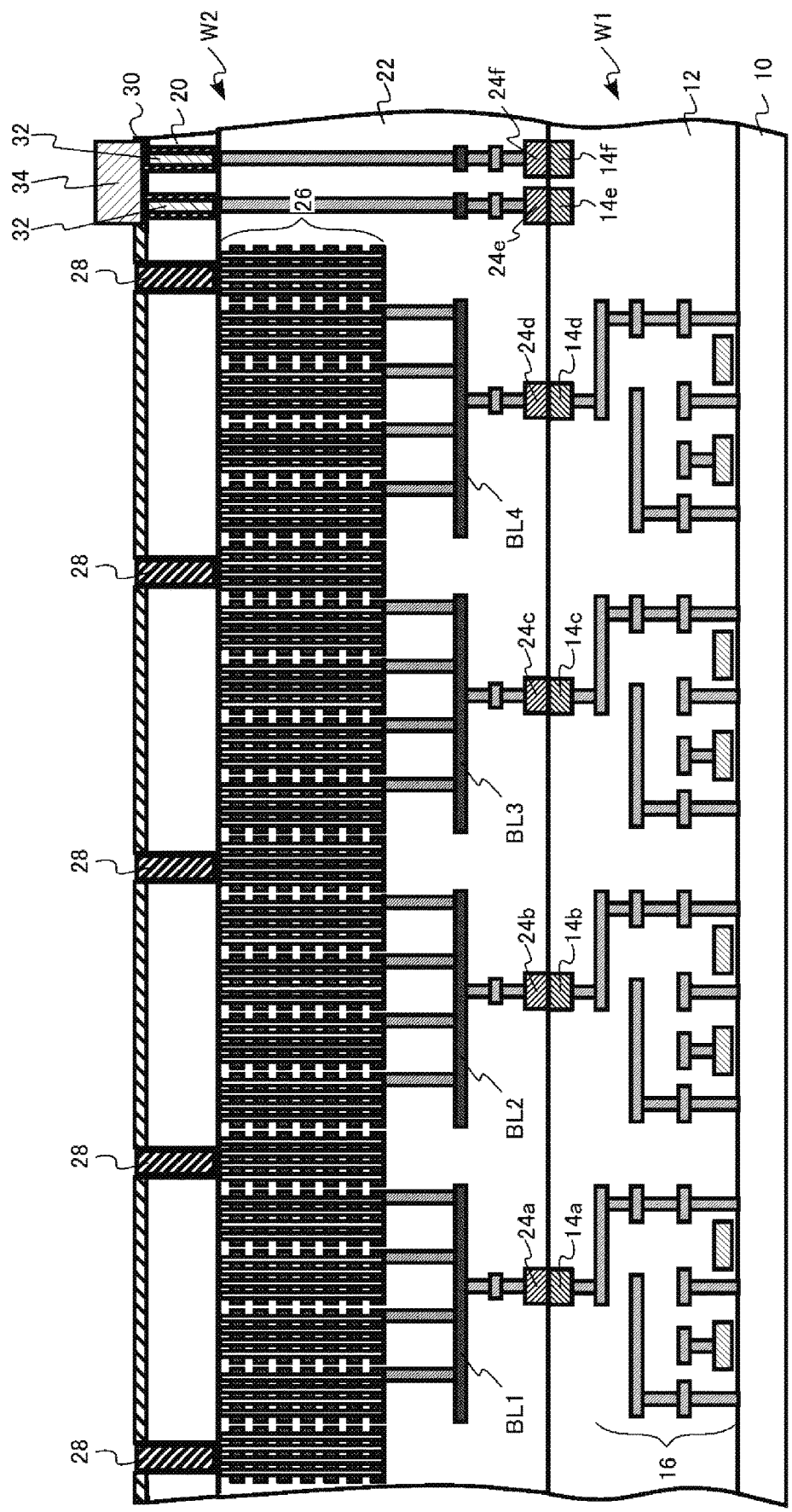

Next, the through via 32 and the terminal pad 34 are formed using a known process technique (FIG. 15). In the formation of the through via 32, an opening may be formed by RIE or the like at the same time as the opening 50 formed in the semiconductor substrate 20 of FIG. 13. The conductor material in the through via 32 can also be formed by simultaneously embedding the same material as a pad electrode 34 in FIG. 15, and the conductor material is, for example, Al or the like.

Next, a passivation film is formed on the back surface insulating layer 30 and the terminal pad 34. Then, the bonded first wafer W1 and second wafer W2 are cut by, for example, blade dicing. By cutting the first wafer W1 and the second wafer W2, a plurality of chips of the flash memory 100 in which the control chip 101 and the memory chip 102 are bonded as shown in FIG. 1 are manufactured.

Next, the operation and effects of the semiconductor memory device according to the first embodiment will be described.

A flash memory can increase its bandwidth by dividing its memory cell array into multiple planes. However, as the number of planes increases, the number of control circuits such as sense amplifier circuits that control each plane also increases, and the chip occupancy ratio of the control circuits increases. As a result, a chip occupancy ratio of the memory cell array is reduced, which works against increasing the capacity of the memory.

The flash memory 100 according to the first embodiment uses an attachment technique for manufacturing. After the control circuit 16 and the memory cell array 26 are manufactured on two different wafers, the two wafers are attached and bonded. By dicing the two bonded wafers, a chip stack in which the control chip 101 having the control circuit 16 and the memory chip 102 having the memory cell array 26 are vertically bonded can be manufactured.

Only the memory cell array 26 is formed in the memory chip 102. Therefore, even if the number of planes increases, the reduction of the chip occupancy ratio for the memory cell array is prevented. Therefore, a flash memory having a wide bandwidth and a large capacity can be obtained.

Further, since the control circuit 16 is manufactured on a wafer different from the memory cell array 26, the control circuit 16 can be formed by a process having a short heat process. This leads to miniaturization of transistors forming the control circuit 16. As a result, the area of the control circuit 16 can be reduced. Therefore, even if the number of planes increases and the number of control circuits such as sense amplifier circuits that control each plane also increases, it is possible to prevent the size of the control chip 101 from increasing.

When dividing the memory cell array into many planes, it is necessary to divide the bit line BL for each plane. That is, it is necessary to divide the bit line BL at the boundary between the memory cell array forming a plane and the memory cell array forming another plane.

For example, consider the case where the memory cell array is divided at the boundary area between two planes. When the memory cell array is divided at the boundary region, the periodicity of the pattern is disturbed near the boundary region. For this reason, the shape abnormality of the pattern of the memory cell array adjacent to the boundary region, for example, the pattern of the memory hole for forming the channel layer is likely to occur. To address this issue, it is desirable to provide a dummy cell region including dummy cells that do not function as a memory cell within the memory cell array adjacent to the boundary region. Providing the dummy cell region reduces the chip occupancy ratio for the memory cell array portions actually functioning as memory, which becomes an obstacle to increasing the number of planes.

In the flash memory 100 of the first embodiment, the memory cell array is not divided in the boundary region between two planes. In other words, the periodicity of the memory cell array is not changed between the two planes.

Specifically, as shown in FIG. 5, the periodicity of the memory cell array 26 does not change at the boundary between the first plane PL1 and the second plane PL2. The periodicity of the memory cell array 26 does not change between the first region 26a of the memory cell array 26 belonging to the first plane PL1 and the second region 26b of the memory cell array 26 belonging to the second plane PL2.

Between the first region 26a and the second region 26b, the word line blocks WLB have a constant first width w1 in the second direction perpendicular to the first direction and are repeatedly arranged at the constant first interval d1. That is, the word line blocks WLB are arranged in the second direction at a constant cycle, that is, the cycle of w1+d1.

The first bit line BL1 belonging to the first plane PL1 and the second bit line BL2 belonging to the second plane PL2 are divided on the memory cell array 26 in which the periodicity of the pattern does not change.

The memory cell array 26 is not divided at the boundary between the first plane PL1 and the second plane PL2, and the periodicity of the memory cell array 26 does not change. Therefore, it is not necessary to provide the dummy cell region in the memory cell array 26. Therefore, even if the number of divided planes is increased, it is possible to prevent the chip occupancy ratio of the memory cell array 26 portions actually functioning as memory from decreasing. Therefore, it becomes easier to increase the number of planes.

The flash memory 100 according to the first embodiment includes the element isolation insulating layer 28 that penetrates the second semiconductor substrate 20. By providing the element isolation insulating layer 28 penetrating the second semiconductor substrate 20, it is possible to electrically separate the first plate region 20a and the second plate region 20b in a short distance. Therefore, the distance between the first plate region 20a and the second plate region 20b can be reduced. Therefore, it is possible to prevent the chip occupancy ratio of the memory cell array 26 portions actually functioning as memory from decreasing due to element isolation between planes. Therefore, it is possible to increase the number of planes.

As described above, according to the first embodiment, by increasing the number of planes, it is possible to provide a semiconductor memory device having a large bandwidth and advanced functions.

Second Embodiment

A semiconductor memory device of a second embodiment is different from the semiconductor memory device of the first embodiment in that two of the plurality of stacked bodies are located between a region between a first wiring and a second wiring and a second semiconductor substrate. A first semiconductor region is surrounded by a first insulating layer that is continuous from a first surface of the second semiconductor substrate on the memory cell array side to a second surface of the second semiconductor substrate on the opposite side of the memory cell array. The second semiconductor region is surrounded by a second insulating layer that is continuous from the first surface to the second surface. The first insulating layer and the second insulating layer are separated from each other.

Figure 16:
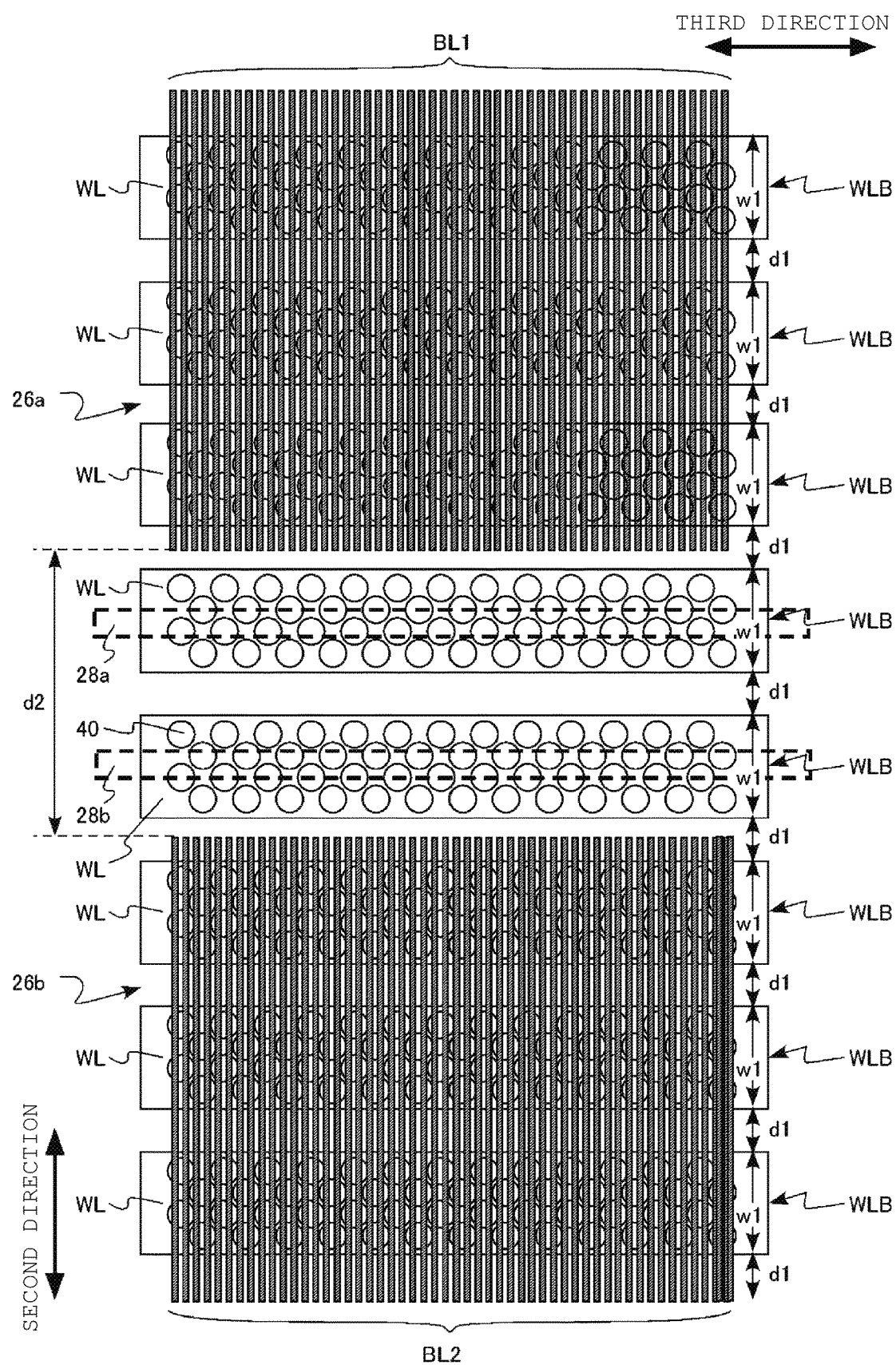
FIG. 16 is a schematic diagram of a semiconductor memory device according to a second embodiment.

FIG. 16 is a schematic diagram of the semiconductor memory device according to the second embodiment.

FIG. 16 shows the positional relationship of the word line WL, the word line block WLB, the channel layer 40, the element isolation insulating layer 28, the first bit line BL1, and the second bit line BL2 when viewed from the plane perpendicular to the first direction. FIG. 16 is a diagram corresponding to FIG. 5 of the first embodiment.

Figure 17:
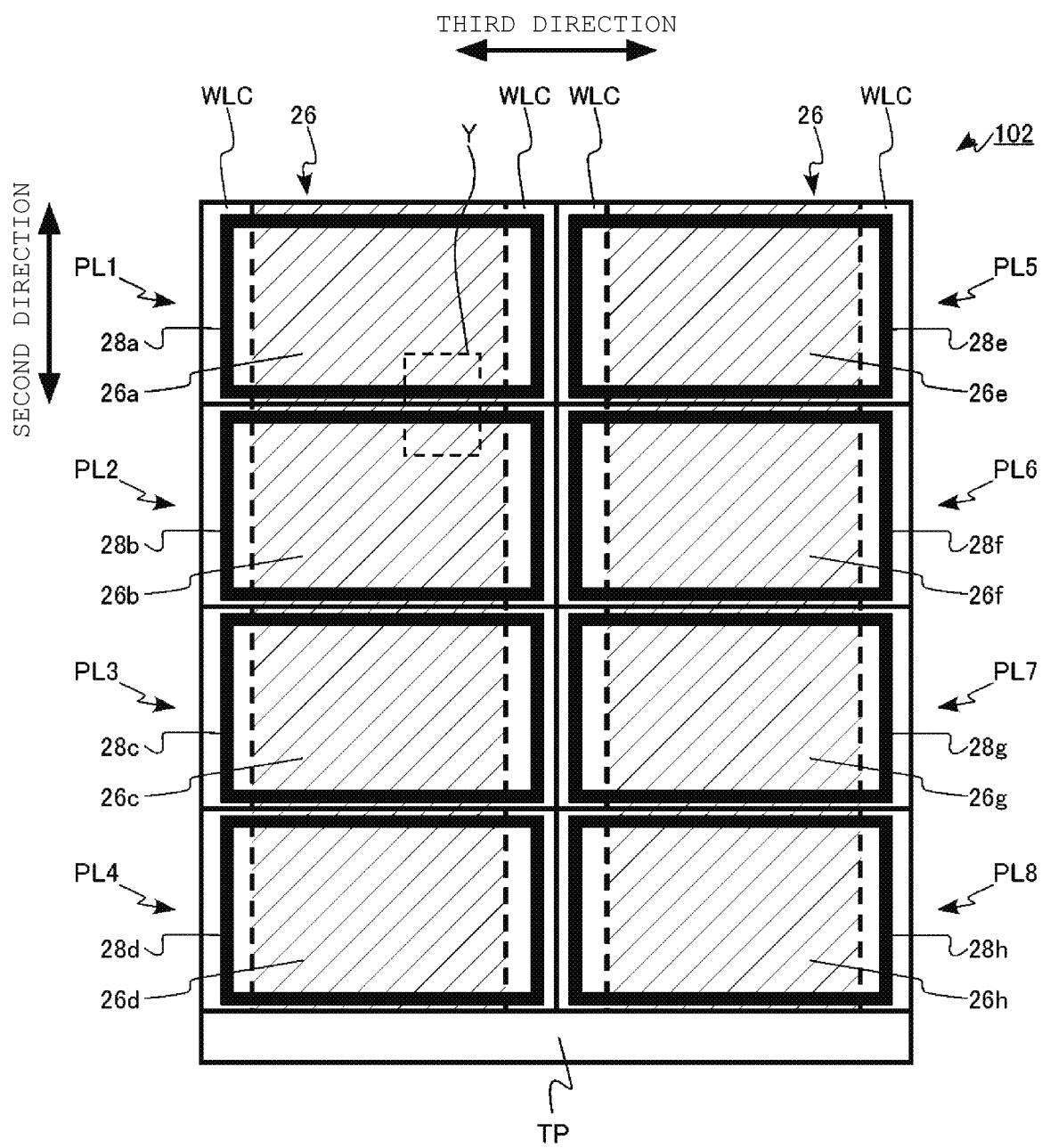
FIG. 17 is a layout diagram of the semiconductor memory device according to the second embodiment.

FIG. 17 is a layout diagram of the semiconductor memory device according to the second embodiment. FIG. 17 shows the layout of the plane of the memory chip 102, the memory cell array, the word line contact region, the terminal pad region, and the element isolation insulating layer. FIG. 17 is a diagram corresponding to FIG. 6 of the first embodiment.

FIG. 16 illustrates an enlarged view of the region Y in FIG. 17. FIG. 16 is a diagram including a boundary between the first plane PL1 and the second plane PL2.

Two of the plurality of word line blocks WLB are located in the portion between the first bit line BL1 and the second bit line BL2, which are divided. Two word line blocks WLB exist between the portion between the first bit line BL1 and the second bit line BL2 and the second semiconductor substrate 20.

The channel layer 40 in the two word line blocks WLB located in the portion between the first bit line BL1 and the second bit line BL2 is not electrically connected to any of the first bit line BL1 and the second bit line BL2. The memory cells in the two word line blocks WLB located in the portion between the first bit line BL1 and the second bit line BL2 are so-called dummy cells that do not operate as memory cells.

The distance (d2 in FIG. 16) between the first bit line BL1 and the second bit line BL2 is smaller than, for example, three times the first width w1 of the word line block WLB.

On the side of the second semiconductor substrate 20 of the two word line blocks WLB located in the portion between the first bit line BL1 and the second bit line BL2, a first element isolation insulating layer 28a and a second element isolation insulating layer 28b are provided. For example, at least a part of the channel layer 40 in the word line block WLB located in the portion between the first bit line BL1 and the second bit line BL2 is in contact with the first element isolation insulating layer 28a or the second element isolation insulating layer 28b.

As shown in FIG. 17, the first element isolation insulating layer 28a surrounds the first region 26a of the memory cell array 26. The first element isolation insulating layer 28a has a frame shape.

The second element isolation insulating layer 28b surrounds the second region 26b of the memory cell array 26. The second element isolation insulating layer 28b has a frame shape.

The first element isolation insulating layer 28a and the second element isolation insulating layer 28b are apart from each other. The first element isolation insulating layer 28a and the second element isolation insulating layer 28b are separated.

The element isolation insulating layer 28 of the first embodiment has a lattice shape. When the element isolation insulating layer 28 has a lattice shape, triple points or quadruple points exist as peculiar portions of the shape. At such a peculiar portion, a defective shape of the element isolation insulating layer 28 is likely to occur.

Since the first element isolation insulating layer 28a and the second element isolation insulating layer 28b of the second embodiment are frame-shaped, there is no peculiar portion having a shape such as triple points or quadruple points. Therefore, defective shapes of the first element isolation insulating layer 28a and the second element isolation insulating layer 28b are unlikely to occur.

A third element isolation insulating layer 28c, a fourth element isolation insulating layer 28d, a fifth element isolation insulating layer 28e, a sixth element isolation insulating layer 28f, a seventh element isolation insulating layer 28g, and an eighth element isolation insulating layer 28h have the same structure as the first element isolation insulating layer 28a and the second element isolation insulating layer 28b. Therefore, they have the same operation and effects as the first element isolation insulating layer 28a and the second element isolation insulating layer 28b.

As described above, according to the second embodiment, by increasing the number of planes, it is possible to provide a semiconductor memory device having a large bandwidth and advanced functions. Further, it is possible to provide a semiconductor memory device that is less likely to have a defective shape.

Third Embodiment

A semiconductor memory device according to a third embodiment is different from the semiconductor memory device according to the first embodiment in that a portion between two adjacent stacked bodies among the plurality of stacked bodies is located between a region between a first wiring and a second wiring and the second semiconductor substrate. The distance between the first wiring and the second wiring is less than the first width.

Figure 18:
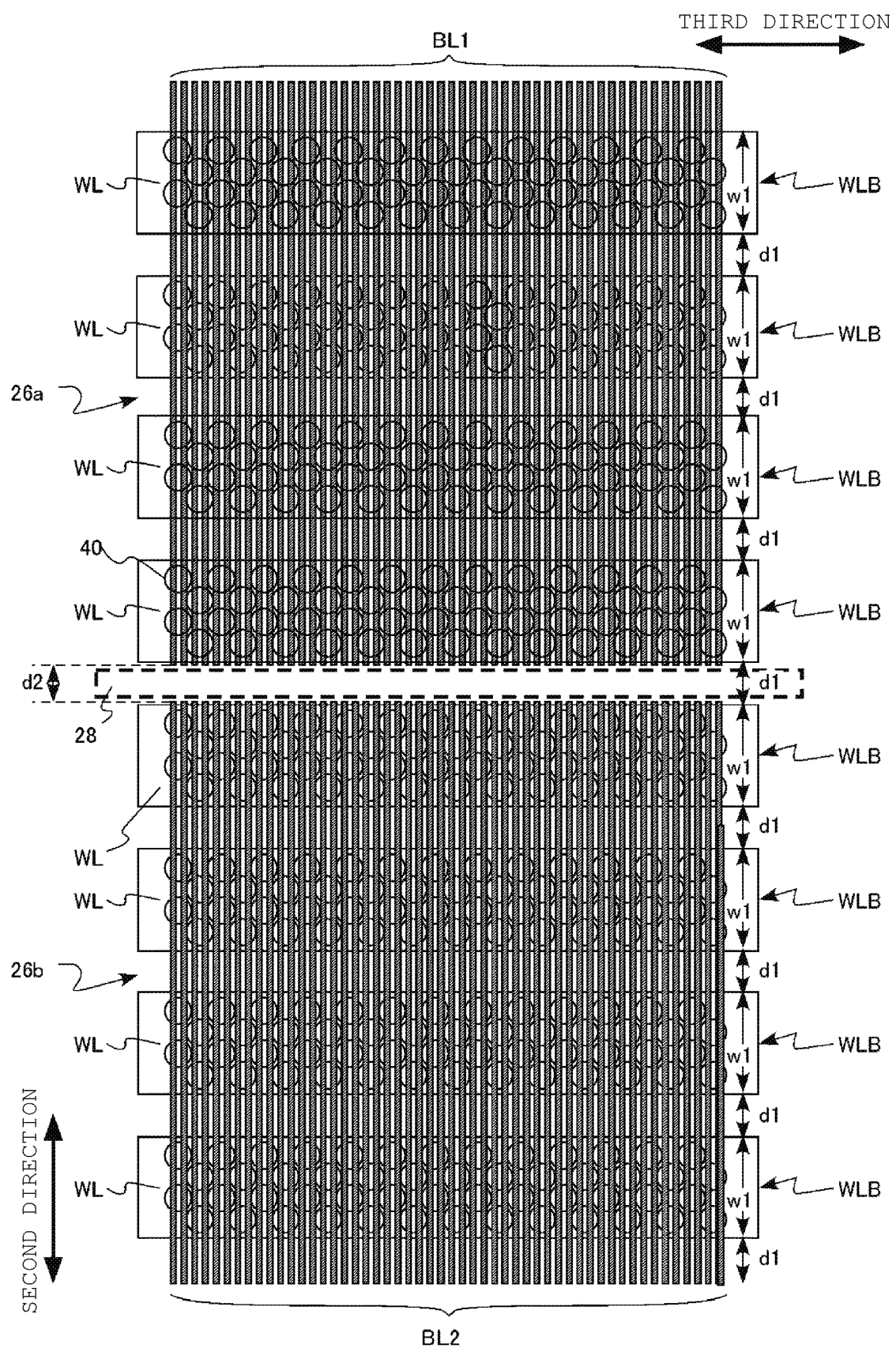
FIG. 18 is a schematic diagram of a semiconductor memory device according to a third embodiment.

FIG. 18 is a schematic diagram of the semiconductor memory device of the third embodiment.

FIG. 18 shows the positional relationship of the word line WL, the word line block WLB, the channel layer 40, the element isolation insulating layer 28, the first bit line BL1, and the second bit line BL2 when viewed from the plane perpendicular to the first direction. FIG. 18 is a diagram corresponding to FIG. 5 of the first embodiment.

A portion between two adjacent word line blocks WLB among the plurality of word line blocks WLB is located in the portion between the first bit line BL1 and the second bit line BL2, which are divided. Between the portion between the first bit line BL1 and the second bit line BL2 and the second semiconductor substrate 20, a portion between two adjacent word line blocks WLB among the plurality of word line blocks WLB is located.

The distance (d2 in FIG. 18) between the first bit line BL1 and the second bit line BL2 is, for example, smaller than the first interval (d1 in FIG. 18) in the second direction of the word line block WLB.

The element isolation insulating layer 28 is provided on the side of the second semiconductor substrate 20 in the portion between the first bit line BL1 and the second bit line BL2. The element isolation insulating layer 28 is provided on the side of the second semiconductor substrate 20 in a portion between two adjacent word line blocks WLB.

In the third embodiment, there is no need to provide memory cells that do not operate as memory cells, that is, so-called dummy cells, in a region that divides the first bit line BL1 and the second bit line BL2, that is, the boundary between the first plane PL1 and the second plane PL2.

Therefore, it is possible to prevent the chip occupancy ratio of the memory cell array 26 portions actually functioning as memory from decreasing. Therefore, it becomes easier to increase the number of planes.

As described above, according to the third embodiment, by increasing the number of planes, it is possible to provide a semiconductor memory device having a large bandwidth and advanced functions.

Fourth Embodiment

A semiconductor memory device of a fourth embodiment is different from the first to third semiconductor memory devices in that the number of planes is different.

Figure 19:
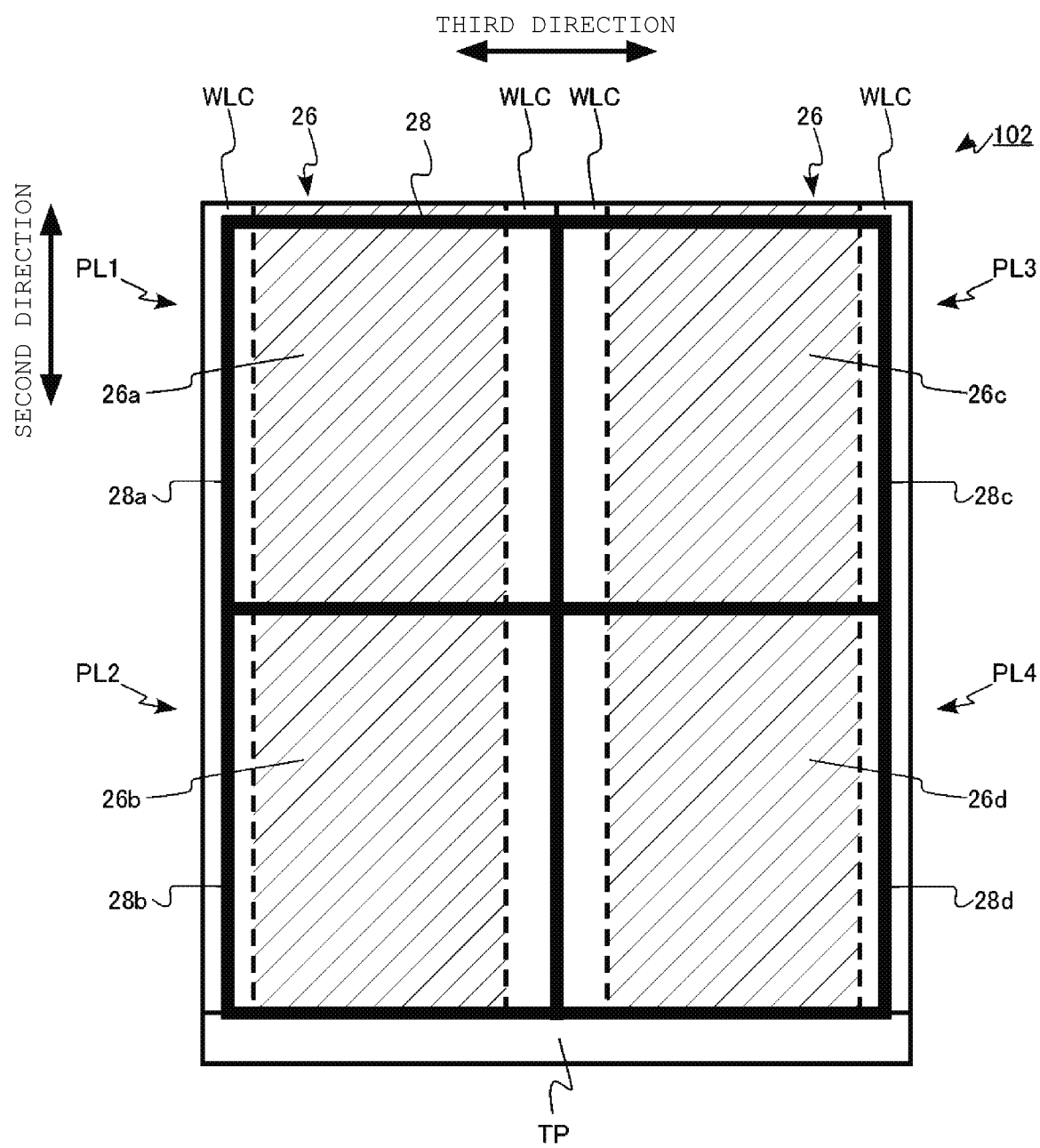
FIG. 19 is a layout diagram of a semiconductor memory device according to a fourth embodiment.

FIG. 19 is a layout diagram of the semiconductor memory device of the fourth embodiment. FIG. 19 shows the layout of the planes of the memory chip 102, the memory cell array, the word line contact region, the terminal pad region, and the element isolation insulating layer. FIG. 19 is a diagram corresponding to FIG. 6 of the first embodiment.

As shown in FIG. 19, the memory chip 102 has four planes. The memory chip 102 includes the first plane PL1, the second plane PL2, the third plane PL3, and the fourth plane PL4.

The first plane PL1 and the second plane PL2 are arranged side by side in the second direction. The memory cell array 26 is arranged across the boundary between the first plane PL1 and the second plane PL2. In the memory cell array 26, regions belonging to the first plane PL1 and the second plane PL2 are the first region 26a and the second region 26b, respectively.

The third plane PL3 and the fourth plane PL4 are arranged side by side in the second direction. The memory cell array 26 is arranged across the boundary between the third plane PL3 and the fourth plane PL4. In the memory cell array 26, regions belonging to the third plane PL3 and the fourth plane PL4 are the third region 26c and the fourth region 26d, respectively.

Figure 20:
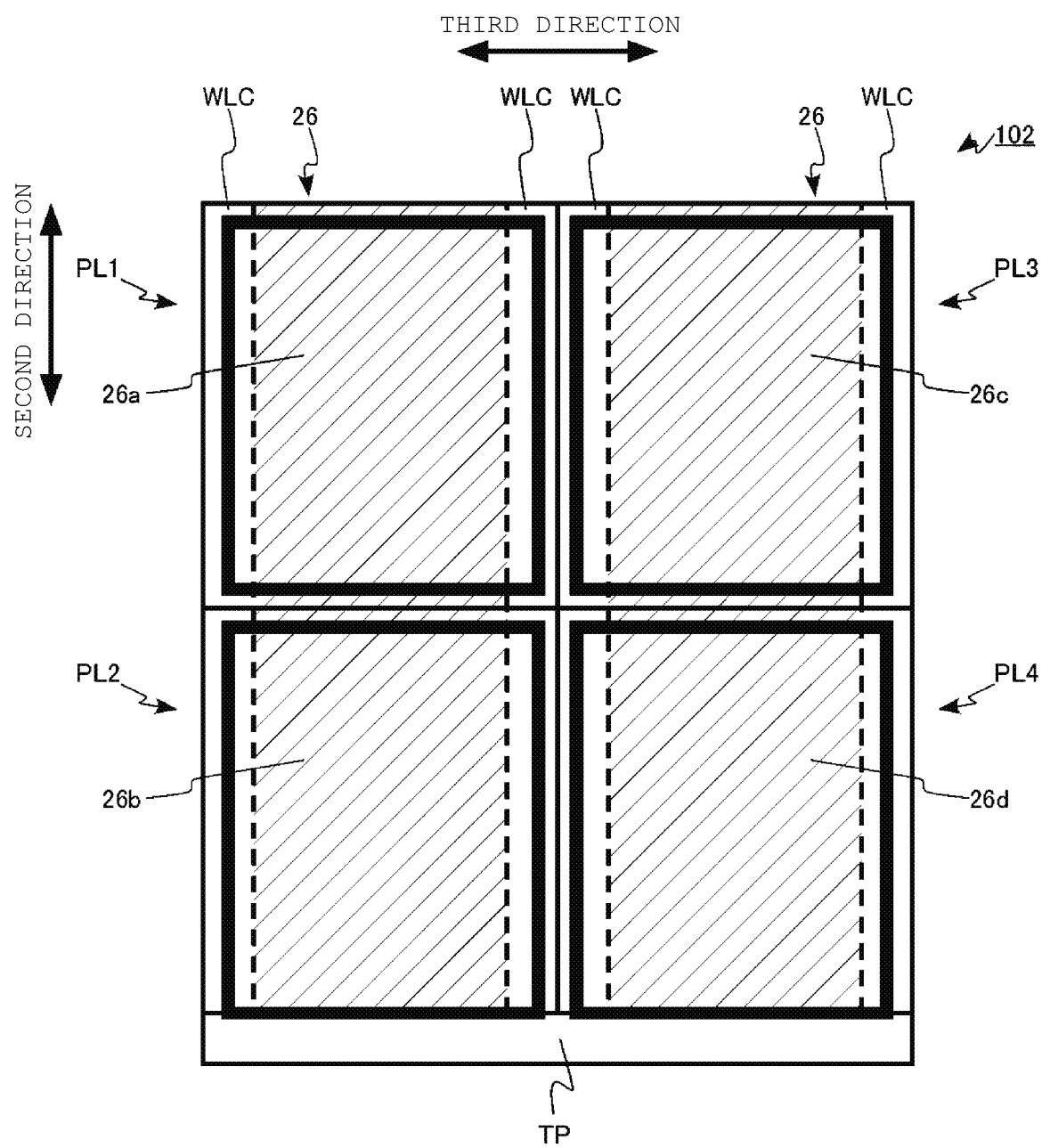
FIG. 20 is a layout diagram of a semiconductor memory device according to a modification example of the fourth embodiment.

FIG. 20 is a layout diagram of a semiconductor memory device according to a modification example of the fourth embodiment. FIG. 20 is a diagram corresponding to FIG. 19.

The first element isolation insulating layer 28a surrounds the first region 26a of the memory cell array 26. The first element isolation insulating layer 28a has a frame shape.

The second element isolation insulating layer 28b surrounds the second region 26b of the memory cell array 26. The second element isolation insulating layer 28b has a frame shape.

The first element isolation insulating layer 28a and the second element isolation insulating layer 28b are apart from each other. The first element isolation insulating layer 28a and the second element isolation insulating layer 28b are separated.

The third element isolation insulating layer 28c surrounds the third region 26c of the memory cell array 26. The third element isolation insulating layer 28c has a frame shape.

The fourth element isolation insulating layer 28d surrounds the fourth region 26d of the memory cell array 26. The fourth element isolation insulating layer 28d has a frame shape.

The third element isolation insulating layer 28c and the fourth element isolation insulating layer 28d are apart from each other. The third element isolation insulating layer 28c and the fourth element isolation insulating layer 28d are separated.

As described above, according to the fourth embodiment and the modification thereof, by increasing the number of planes, it is possible to provide a semiconductor memory device having a large bandwidth and advanced functions.

In the first to fourth embodiments, the number of planes of the memory chip 102 is 8 or 4 as an example, but the number of planes is not limited to 8 or 4, as long as the number of planes is 2 or more.

In the first to fourth embodiments, the element isolation insulating layer 28 penetrates the second semiconductor substrate 20, but it is also possible to adopt a form in which the element isolation insulating layer does not penetrate the second semiconductor substrate 20.

In the first to fourth embodiments, the sticking interface S is defined. However, in the final product of a flash memory, the position of the sticking interface S of the control chip 101 and the memory chip 102 may not be clearly distinguishable. However, the position of the sticking interface S can be determined based on a positional shift between the first metal pad 14 and the second metal pad 24, for example.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:
1. A semiconductor memory device, comprising:
a first chip including a first semiconductor substrate and a first transistor and a second transistor that are provided on the first semiconductor substrate; and
a second chip stuck to the first chip, the second chip including a memory cell array and a first wiring layer provided between the memory cell array and the first chip in a first direction, the first wiring layer including a first wire and a second wire;
a first pad provided on a surface of the first chip that is stuck to the second chip, the first pad electrically connecting the first transistor to the first wire; and
a second pad provided on a surface of the first chip that is stuck to the second chip, the second pad electrically connecting the second transistor to the second wire, wherein
the memory cell array includes:
a first region, a second region, and a third region arranged in order in a second direction perpendicular to the first direction, each of which includes a plurality of gate electrodes stacked in the first direction;
a fourth region between the first region and the second region, the fourth region including an insulator and extending in the first direction and a third direction that is perpendicular to the first direction and the second direction;
a fifth region between the second region and the third region, the fifth region including an insulator and extending in the first direction and the third direction;
a first semiconductor layer extending in the first region of the memory cell array in the first direction;
a second semiconductor layer extending in the second region of the memory cell array in the first direction; and a third semiconductor layer extending in the third region of the memory cell array in the first direction, the first wire and the second wire are aligned with each other in the second direction with a gap between the first wire and the second wire in the second direction, the first wire is electrically connected to the first semiconductor layer, no wire in the first wiring layer is electrically connected to the second semiconductor layer, and the second wire is electrically connected to the third semiconductor layer.

2. The semiconductor memory device according to claim 1, wherein the gate electrodes in the first region and the gate electrodes in the second region are word lines.

3. The semiconductor memory device according to claim 1, wherein the first wire is a bit line, and the second wire is a bit line.

4. The semiconductor memory device according to claim 1, wherein the first wire is between the first region of the memory cell array and the first chip in the first direction, and the second wire is between the second region of the memory cell array and the first chip in the first direction.

5. The semiconductor memory device according to claim 1, wherein a length of the gap in the second direction is greater than a width of the first region in the second direction and less than twice the width of the first region in the second direction.

6. The semiconductor memory device according to claim 1, wherein a length of the gap in the second direction is greater than twice a width of the first region in the second direction and less than three times the width of the first region in the second direction.

7. The semiconductor memory device according to claim 1, wherein a length of the gap in the second direction is less than a width of the first region in the second direction.

8. The semiconductor memory device according to claim 1, wherein the second chip includes a second semiconductor substrate that includes a first semiconductor region and a second semiconductor region electrically isolated from each other, the first semiconductor region is electrically connected to the first semiconductor layer, and not to the second semiconductor layer and the third semiconductor layer, and the second semiconductor region is electrically connected to the third semiconductor layer, and not to the first semiconductor layer and the second semiconductor layer.

9. The semiconductor memory device according to claim 8, wherein the second semiconductor substrate includes a first insulating region extending from a first surface of the second semiconductor substrate to a second surface of the second semiconductor substrate opposite to the first surface in the first direction, and the first insulating region surrounds the first semiconductor region.

10. The semiconductor memory device according to claim 9, wherein the first insulating region also surrounds the second semiconductor region.

11. The semiconductor memory device according to claim 9, wherein the second semiconductor substrate also includes a second insulating region extending from the first surface to the second surface, and the second insulating region is separated from the first insulating region and surrounds the second semiconductor region.

12. The semiconductor memory device according to claim 1, wherein the first transistor is included in a first sense amplifier circuit, and the second transistor is included in a second sense amplifier circuit.

* * * * *